(12) United States Patent
Hwang et al.

(10) Patent No.: US 9,762,240 B2
(45) Date of Patent: Sep. 12, 2017

(54) CLOCK GATING CIRCUIT THAT OPERATES AT HIGH SPEED

(71) Applicant: SAMSUNG ELECTRONICS CO., LTD., Suwon-si, Gyeonggi-do (KR)

(72) Inventors: Hyunchul Hwang, Suwon-si (KR); Minsu Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/153,799

(22) Filed: May 13, 2016

(65) Prior Publication Data

US 2016/0373112 A1 Dec. 22, 2016

(30) Foreign Application Priority Data

Jun. 22, 2015 (KR) .......................... 10-2015-0088399

(51) Int. Cl.
*H03K 19/00* (2006.01)

(52) U.S. Cl.
CPC ..... *H03K 19/0016* (2013.01); *H03K 19/0013* (2013.01)

(58) Field of Classification Search
CPC ....... H03K 19/018528; H03K 19/0013; H03K 19/007; H03K 19/0019; H03K 19/0966; H03K 19/215; H03K 19/20
USPC ........ 327/109, 202, 218, 333, 198, 215, 225
See application file for complete search history.

(56) References Cited

U.S. PATENT DOCUMENTS

| | | | |
|---|---|---|---|
| 7,154,319 B2 | 12/2006 | Kim | |
| 7,365,575 B2 | 4/2008 | Kim | |
| 7,902,878 B2 | 3/2011 | Saint-Laurent et al. | |
| 8,433,025 B2 | 4/2013 | Sun et al. | |
| 8,570,069 B2 | 10/2013 | Zid et al. | |
| 8,890,573 B2 | 11/2014 | Elkin et al. | |
| 9,059,693 B2 | 6/2015 | Singh et al. | |
| 2005/0040873 A1* | 2/2005 | Wada ..................... | H03K 3/012 327/215 |
| 2008/0074151 A1 | 3/2008 | Kim | |
| 2014/0184271 A1 | 7/2014 | Gurumurthy et al. | |
| 2014/0247077 A1* | 9/2014 | Singh ..................... | H03K 3/037 327/199 |

FOREIGN PATENT DOCUMENTS

KR 1020080064307 A 7/2008

* cited by examiner

*Primary Examiner* — John Poos
(74) *Attorney, Agent, or Firm* — Volentine & Whitt, PLLC

(57) ABSTRACT

A clock gating circuit includes a first precharge unit charging a first node based on a clock signal, a second precharge unit charging a second node based on the clock signal, a first discharge unit discharging the first node based on the clock signal, a second discharge unit discharging the second node based on the clock signal, a first cross-coupled maintain unit maintaining the first node at a charge state according to a voltage level of the second node, a second cross-coupled maintain unit maintaining the second node at a charge state according to a voltage level of the first node, and a control unit controlling the first and second discharge units to discharge the first node or the second node on the basis of a clock enable signal.

19 Claims, 24 Drawing Sheets and a second end connected to a second node at which an output clock signal is provided, the second transistor configured to be turned on according to the clock signal to charge the second node; a third transistor having a first end connected to the power supply node and a second end connected to the first node, the third transistor configured to be turned on according to a voltage level of the second node to charge the first node; a fourth transistor having a first end connected to the power supply node and a second end connected to the second node, the fourth transistor configured to be turned on according to a voltage level of the first node to charge the second node; a fifth transistor configured to be turned on according to the clock signal; a sixth transistor having a first end connected to a first end of the fifth transistor, the sixth transistor configured to be turned on according to a voltage level of a third node to discharge the first node; a seventh transistor having a first end connected to the second node and a second end connected to the third node, the seventh transistor configured to be turned on according to the clock signal to discharge the second node based on a voltage level of the third node; and a control unit configured to control the voltage level of the third node based on a clock enable signal so that the first node or the second node is discharged. In a case that the fifth and sixth transistors are turned on, a second end of the fifth transistor and a second end of the sixth transistor are connected to the first node to discharge the first node.

CLOCK GATING CIRCUIT THAT OPERATES AT HIGH SPEED

CROSS-REFERENCE TO RELATED APPLICATIONS

A claim for priority under 35 U.S.C. §119 is made to Korean Patent Application No. 10-2015-0088399, filed on Jun. 22, 2015, the entire contents of which are hereby incorporated by reference.

BACKGROUND

The inventive concepts herein relate to semiconductor devices, and more particularly, to a clock gating circuit that operates at high speed.

In general, digital systems may be classified as combination circuits and sequential circuits. A combination circuit is constituted by logic gates, and outputs of the logic gates are sequentially determined by current input values. A combination circuit performs an information processing operation that may be logically expressed by a series of Boolean expressions. Sequential circuits use a storage device such as a flip-flop which may be constituted by additional logic gates. An output of the storage device is a function of a current input and a state of the storage device. The state of the storage device is a function of previous inputs.

A digital system includes a plurality of functional blocks to perform an information processing operation. However, not every functional block is used while performing a particular information processing operation. Thus, it is necessary to block provision of a clock signal to a block that does not operate during a particular processing operation, so as to reduce power consumption or heating. A clock gating circuit performs the function of blocking provision of a clock signal to a functional block that does not operate in a digital system.

SUMMARY

Embodiments of the inventive concept provide a clock gating circuit. The clock gating circuit includes a first precharge unit configured to charge a first node based on a clock signal, a second precharge unit configured to charge a second node based on the clock signal, a first discharge unit configured to discharge the first node based on the clock signal, a second discharge unit configured to discharge the second node based on the clock signal, a first cross-coupled maintain unit configured to maintain the first node at a charge state according to a voltage level of the second node, a second cross-coupled maintain unit configured to maintain the second node at a charge state according to a voltage level of the first node, and a control unit configured to control the first and second discharge units to discharge the first node or the second node based on a clock enable signal. The control unit is configured to control the second discharge unit so that an output clock signal having a waveform corresponding to the clock signal is output at the second node during a specific time according to the clock enable signal.

Embodiments of the inventive concept also provide a clock gating circuit. The clock gating circuit includes a first transistor having a first end connected to a power supply node and a second end connected to a first node, the first transistor configured to be turned on according to a clock signal to charge the first node; a second transistor having a first end connected to the power supply node and a second end connected to a second node at which an output clock Embodiments of the inventive concept also provide a clock gating circuit. The clock gating circuit includes a first precharge unit configured to charge a first node based on a clock signal; a second precharge unit configured to charge a second node based on the clock signal; a first discharge unit configured to discharge the first node based on the clock signal; a second discharge unit configured to discharge the second node based on the clock signal; a first cross-coupled maintain unit configured to maintain the first node at a charge state according to a voltage level of the second node; a second cross-coupled maintain unit configured to maintain the second node at the charge state according to a voltage level of the first node; and a control unit configured to control the first and second discharge units to discharge the first node or the second node responsive to a clock enable signal, the voltage level of the first node, and an inverted voltage level of the second node.

BRIEF DESCRIPTION OF THE FIGURES

Preferred embodiments of the inventive concept will be described below in more detail with reference to the accompanying drawings. The embodiments of the inventive concept may, however, be implemented in different forms and should not be construed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION

Figure 1:
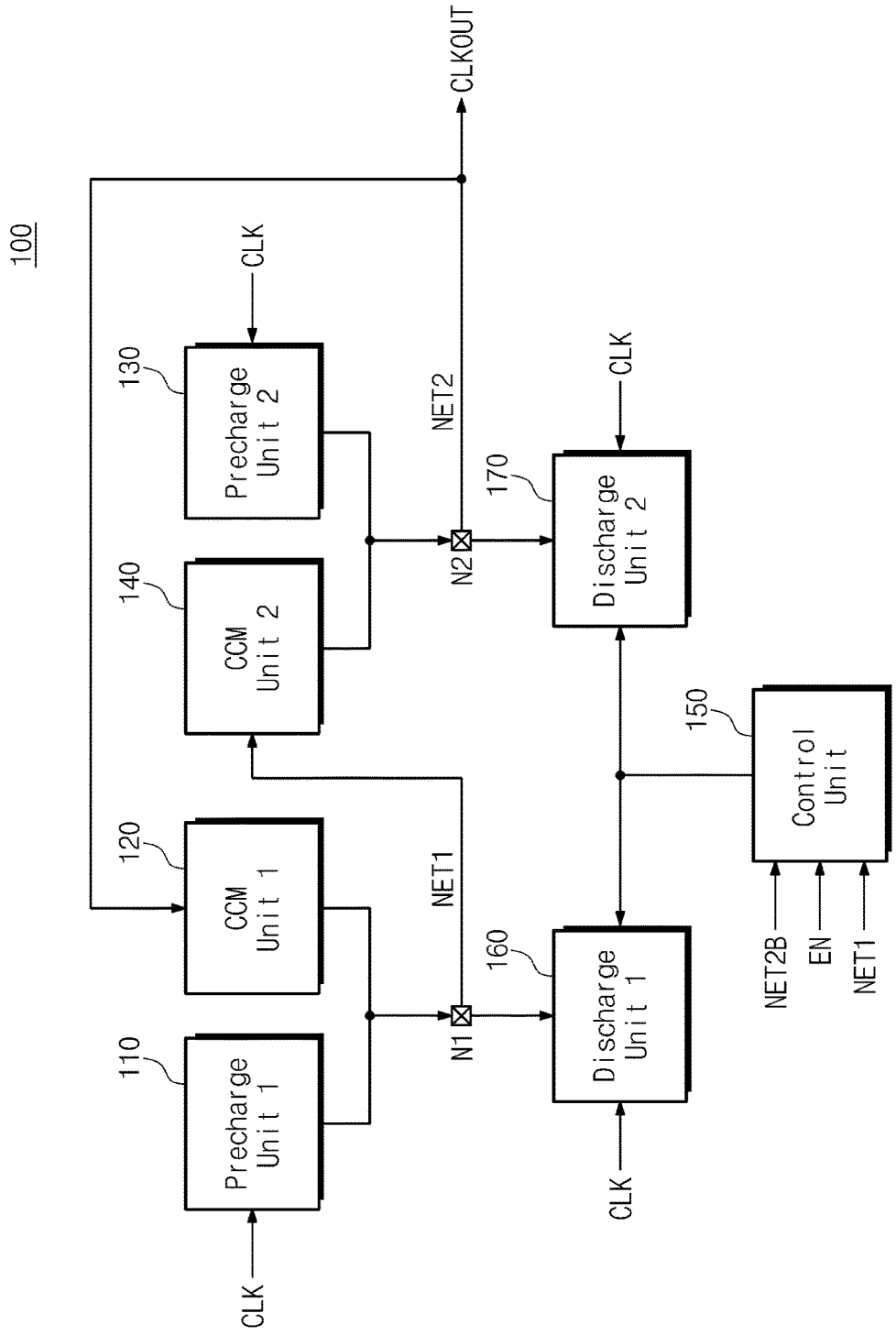
FIG. 1 illustrates a block diagram of a clock gating circuit in accordance with an embodiment of the inventive concept.

Embodiments of inventive concepts will be described more fully hereinafter with reference to the accompanying drawings, in which embodiments of the inventive concept are shown. This inventive concept may, however, be implemented in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

FIG. 1 illustrates a block diagram of a clock gating circuit in accordance with an embodiment of the inventive concept. Referring to FIG. 1, the clock gating circuit 100 includes first and second precharge units 110 and 130, first and second cross-coupled maintain (CCM) units 120 and 140, first and second discharge units 160 and 170, and a control unit 150. The clock gating circuit 100 may or may not transmit a clock signal CLK as an output clock signal CLKOUT according to a clock enable signal EN.

The first and second precharge units 110 and 130 may change first and second internal signals NET1 and NET2 to have a first level according to the clock signal CLK. For example, the first level may be a high level. The first and second discharge units 160 and 170 may change the first and second internal signals NET1 and NET2 to have a second level according to the clock signal CLK and a control of the control unit 150. For example, the second level may be a low level. The control unit 150 performs a logical operation on the clock enable signal EN, the first internal signal NET1 and an inverted signal NET2B (which is the second internal signal NET2 inverted) to generate an output signal for controlling the first and second discharge units 160 and 170.

When the second internal signal NET2 is changed to have the second level, the first cross-coupled maintain (CCM) unit 120 receives the second internal signal NET2 and maintains the first internal signal NET1 at the first level. When the first internal signal NET1 is changed to have the second level, the second cross-coupled maintain (CCM) unit 140 receives the first internal signal NET1 and maintains the second internal signal NET2 at the first level.

In the case that the clock enable signal EN is the first level, the second discharge unit 170 changes the second internal signal NET2 to the second level. At this time, the first cross-coupled maintain (CCM) unit 120 maintains the first internal signal NET1 at the first level. In the case that the clock enable signal EN is the second level, the first discharge unit 160 changes the first internal signal NET1 to the second level. At this time, the second cross-coupled maintain (CCM) unit 140 maintains the second internal signal NET2 at the first level.

Through the operations described above, the clock gating circuit 100 may or may not transmit the clock signal CLK as the output clock signal CLKOUT according to the clock enable signal EN. For example, the clock gating circuit 100 can control the first and second internal signals NET1 and NET2 to generate the output clock signal CLKOUT. The clock gating circuit 100, in the case that the clock enable signal EN has the first level, transmits the clock signal CLK as the output clock signal CLKOUT. The clock gating circuit 100, in the case that the clock enable signal EN has the second level, does not transmit the clock signal CLK as the output clock signal CLKOUT.

The clock gating circuit 100 can thus reduce the number of gates between the clock enable signal EN and the output clock signal CLKOUT, to reduce an electric wave delay. The clock gating circuit 100 can control the first and second discharge units 160 and 170 through the one control unit 150 to reduce an error of a clock gating operation.

Figure 2:
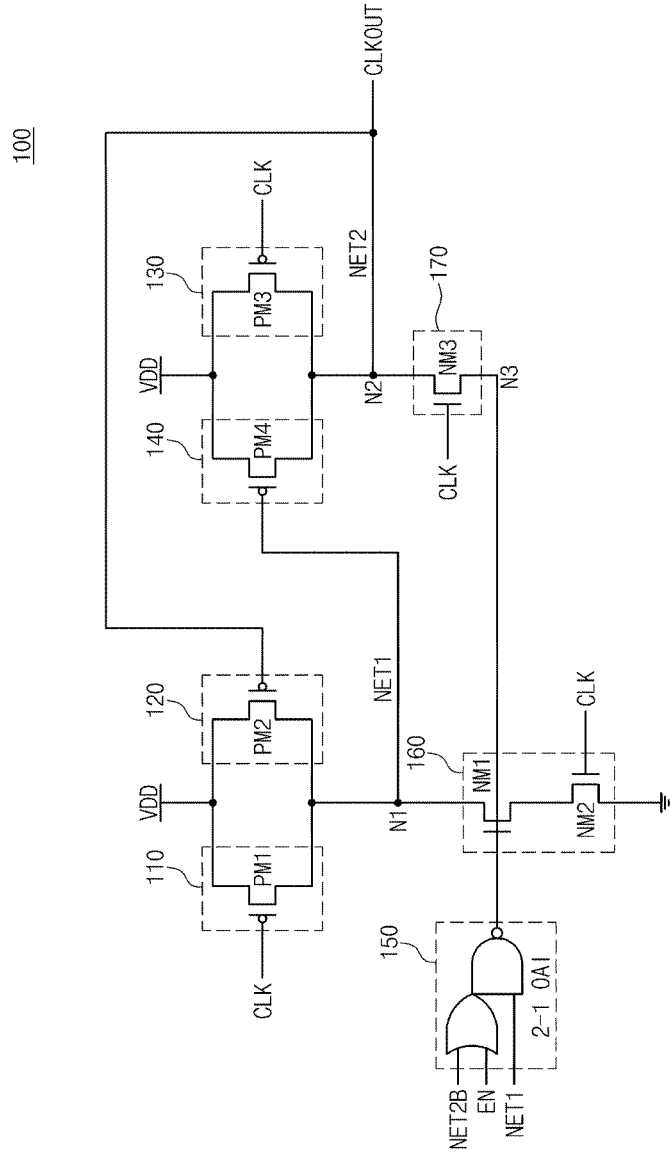
FIG. 2 illustrates a circuit diagram of a clock gating circuit of FIG. 1.

FIG. 2 illustrates a circuit diagram of a clock gating circuit of FIG. 1. Referring to FIG. 2, the control unit 150 is constituted by an OR-AND-Invert (OAI) logic circuit. For example, the OAI logic circuit may be a 2-1 OAI logic circuit including an OR gate and an AND gate, with two OR gate inputs and an AND gate input. The control unit 150 performs a logical operation on the clock enable signal EN, the first internal signal NET1 and the inverted signal NET2B of the second internal signal to generate an output signal for controlling the first and second discharge units 160 and 170. That is, the clock enable signal EN and the inverted signal NET2B are provided as inputs to the OR gate, the output of the OR gate and the first internal signal NET1 are provided as inputs to the AND gate, and the inverted output of the AND gate is provided as an output of the control unit 150.

Further referring to FIG. 2, the CCM unit 120 and the CCM unit 140 are respectively implemented by second and fourth PMOS transistors PM2 and PM4. The first discharge unit 160 is implemented by first and second NMOS transistors NM1 and NM2. The second discharge unit 170 is implemented by a third NMOS transistor NM3.

The first and second precharge units 110 and 130 respectively charge first and second nodes N1 and N2 to a power supply voltage VDD. For example, the first and second precharge units 110 and 130 may be respectively implemented by first and third PMOS transistors PM1 and PM3. When the clock signal CLK has a low level, the first and third PMOS transistors PM1 and PM3 are turned on. Thus, the first and second nodes N1 and N2 may be charged to the power supply voltage VDD.

At this time, since the first internal signal NET1 has a high level and the inverted signal NET2B of the second internal signal has a low level, the control unit 150 operates as an inverter inverting the clock enable signal EN. For example, when the clock enable signal EN has a high level, a third node N3 has a low level. Thus, the first NMOS transistor NM1 is turned off. If a level of the clock signal CLK is changed to a high level, a third NMOS transistor NM3 is turned on. Thus, the second node N2 is discharged through the control unit 150. If the second node N2 is discharged, the second PMOS transistor PM2 is turned on by the second internal signal NET2 of low level. Thus, the first node N1 is maintained at the power supply voltage VDD.

For example, in the case that the clock enable signal EN has a low level, the third node N3 is a high level. Thus, the first NMOS transistor NM1 is turned on. If the clock signal CLK is changed to a high level, the second and third NMOS transistors NM2 and NM3 are turned on. Thus, the first node N1 is discharged. If the first node N1 is discharged, a fourth PMOS transistor PM4 is turned on by the first internal signal NET1 of a low level. Thus, the second node N2 is maintained at the power supply voltage VDD.

The first and second precharge units 110 and 130 charge the first and second nodes N1 and N2 according to the clock signal CLK. The first and second discharge units 160 and 170 discharge the first and second nodes N1 and N2 according to the clock signal CLK and a control of the control unit 150.

The control unit 150 controls the first and second discharge units 160 and 170 to discharge the first and second nodes N1 and N2 according to the clock enable signal EN. The first and second internal signals NET1 and NET2 are signals of which levels are changed depending on a charge-discharge of the first and second nodes N1 and N2.

When a level of the second internal signal NET2 is changed to a low level, the first cross-coupled maintain (CCM) unit 120 maintains the first internal signal NET1 at a high level. When a level of the first internal signal NET1 is changed to a low level, the second cross-coupled maintain (CCM) unit 140 maintains the second internal signal NET2 at the high level.

The clock gating circuit 100 thus may or may not transmit the clock signal CLK depending on the clock enable signal EN. The clock gating circuit 100 as implemented can reduce the number of gates between the clock enable signal EN and the output clock signal CLKOUT to reduce an electric wave delay. The clock gating circuit 100 can control the first and second discharge units 160 and 170 through the control unit 150 to reduce an error of a clock gating operation.

Figure 3:
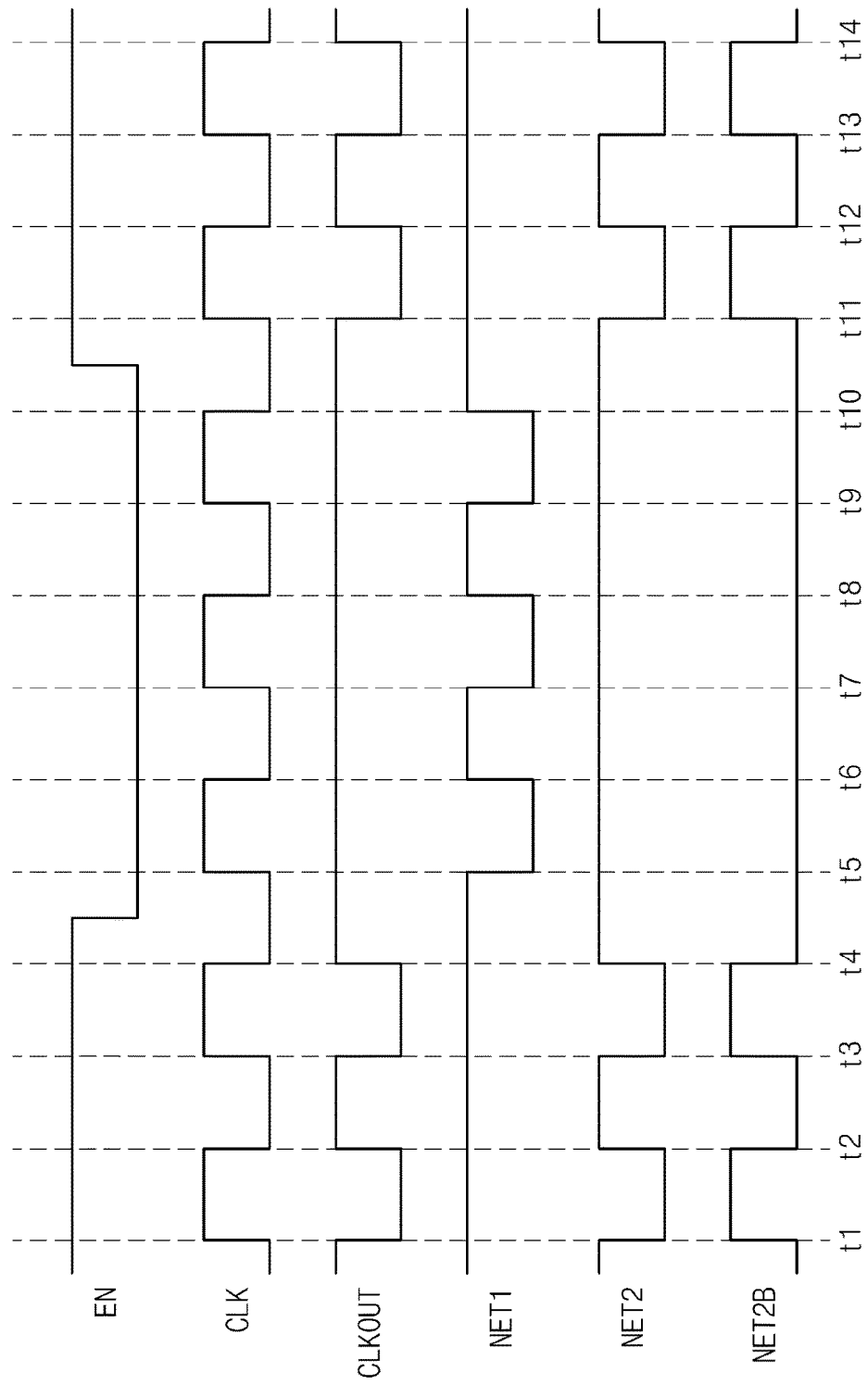
FIG. 3 illustrates a timing diagram of waveforms of signals in FIG. 2.

FIG. 3 illustrates a timing diagram of waveforms of signals in FIG. 2. Referring to FIGS. 2 and 3, the output clock signal CLKOUT is changed only when a level of the clock enable signal EN is high.

Before a first time t1, since the clock signal CLK has a low level, the first and second internal signals NET1 and NET2 have a high level. During a period t1~t4 in which the clock enable signal EN has a high level, the second internal signal NET2 repeatedly switches between a low level and a high level according to the clock signal CLK. For example, if the clock signal CLK has a high level, a level of the second internal signal NET2 is low. If the clock signal CLK has a low level, a level of the second internal signal NET2 is high. At this time, the first internal signal NET1 is maintained at a high level by the first cross-coupled maintain (CCM) unit 120. The second internal signal NET2 is output as an output clock signal CLKOUT.

Between a fourth time t4 and a fifth time t5, a level of the clock enable signal EN is changed to low. During a period t5~t10 in which the clock enable signal EN has a low level, the first internal signal NET1 repeatedly switches between a low level and a high level according to the clock signal CLK. For example, if the clock signal CLK has a high level, the first internal signal NET1 has a low level. If the clock signal CLK has a low level, the first internal signal NET1 has a high level. At this time, the second internal signal NET2 is maintained at a high level by the second cross-coupled maintain (CCM) unit 140. The second internal signal NET2 is output as the output clock signal CLKOUT.

Thus, in the case that the clock enable signal EN is activated (at a high level), an inverted clock signal CLK is transmitted as the output clock signal CLKOUT. In the case that the clock enable signal EN is deactivated (at a low level), the inverted clock signal CLK is not transmitted as the output clock signal CLKOUT.

Figure 4:
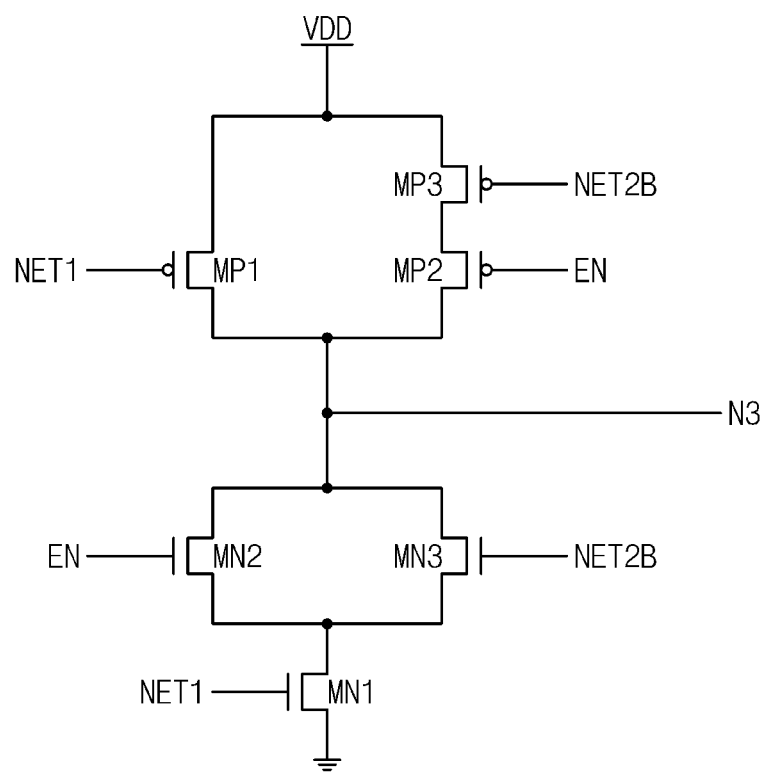
FIG. 4 illustrates a circuit diagram of a 2-1 OR-AND-Invert (OAI) logical circuit of a control unit of FIG. 2.

FIG. 4 illustrates a circuit diagram of a 2-1 OAI logical circuit of a control unit of FIG. 2. Referring to FIGS. 2 and 4, the control unit 150 is constituted by PMOS and NMOS transistors MP1, MP2, MP3, MN1, MN2 and NM3. However, the control unit 150 is not limited thereto.

A gate of the first PMOS transistor MP1 receives the first internal signal NET1. A gate of the second PMOS transistor MP2 receives the clock enable signal EN. A gate of the third PMOS transistor MP3 receives the inverted signal NET2B of the second internal signal. For example, in the case that the first internal signal NET1 has a low level, the third node N3 is charged to the power supply voltage VDD. In the case that the clock enable signal EN and the inverted signal NET2B of the second internal signal have a low level, the third node N3 is also charged to the power supply voltage VDD.

A gate of the first NMOS transistor MN1 receives the first internal signal NET1. A gate of the second NMOS transistor MN2 receives the clock enable signal EN. A gate of the third NMOS transistor MN3 receives the inverted signal NET2B of the second internal signal. For example, in the case that the first internal signal NET1 and the clock enable signal EN have a high level, the third node N3 is discharged to a ground voltage. In the case that the first internal signal NET1 and the inverted signal NET2B of the second internal signal have a high level, the third node N3 is discharged to a ground voltage.

Thus, the control unit 150 can perform an OR operation on the clock enable signal EN and the inverted signal NET2B of the second internal signal, perform an AND operation on the first internal signal NET1 and the value obtained by performing the OR operation, and then invert the AND operation result to provide the output N3.

Figure 5:
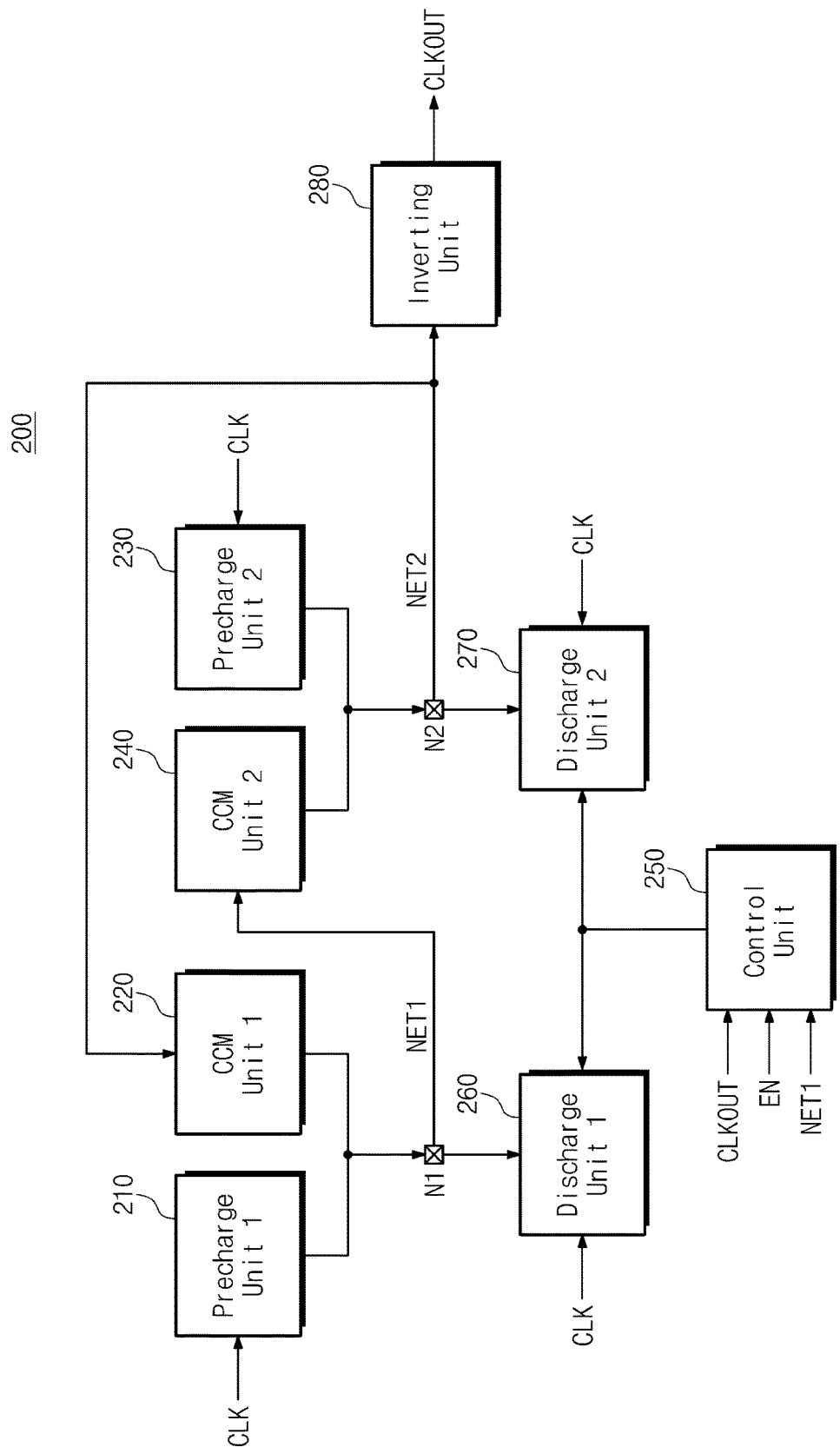
FIG. 5 illustrates a block diagram of a clock gating circuit in accordance with another embodiment of the inventive concept.

FIG. 5 illustrates a block diagram of a clock gating circuit in accordance with another embodiment of the inventive concept. Referring to FIG. 5, the clock gating circuit 200 includes first and second precharge units 210 and 230, first and second cross-coupled maintain (CCM) units 220 and 240, first and second discharge units 260 and 270, a control unit 250 and an inverting unit 280. The clock gating circuit 200 may or may not transmit a clock signal CLK as an output clock signal CLKOUT according to a clock enable signal EN.

The control unit 250 receives a first internal signal NET1, the clock enable signal EN and the output clock signal CLKOUT. The control unit 250 performs a logic operation on the clock enable signal EN, the first internal signal NET1 and the output clock signal CLKOUT to generate an output signal for controlling the first and second discharge units 260 and 270. The control unit 250 controls the first and second discharge units 260 and 270 according to the clock enable signal EN. For example, in the case that the clock enable signal EN has a first level, the control unit 250 controls the first discharge unit 260 so that the first internal signal NET1 is changed according to the clock signal CLK. In the case that the clock enable signal EN has a second level, the control unit 250 controls the second discharge unit 270 so that the second internal signal NET2 is changed according to the clock signal CLK.

The inverting circuit 280 inverts a second internal signal NET2 to generate the output clock signal CLKOUT. Most operations of the clock gating circuit 200 are the same as or similar to the clock gating circuit 100 of FIG. 1, the units being designated by similar reference numerals. The clock gating circuit 200 additionally includes inverting unit 280 that provides output clock signal CLKOUT, which is also provided as an input to control unit 250. Detailed description of the units of the clock gating circuit 200 and their corresponding operation that are similar to that of the clock gating unit 100 may be omitted from the following for the sake of brevity.

The clock gating circuit 200 can reduce the number of gates between the clock enable signal EN and the output clock signal CLKOUT, to reduce an electric wave delay. The clock gating circuit 200 can control the first and second discharge units 260 and 270 through the one control unit 250 to reduce an error of a clock gating operation.

Figure 6:
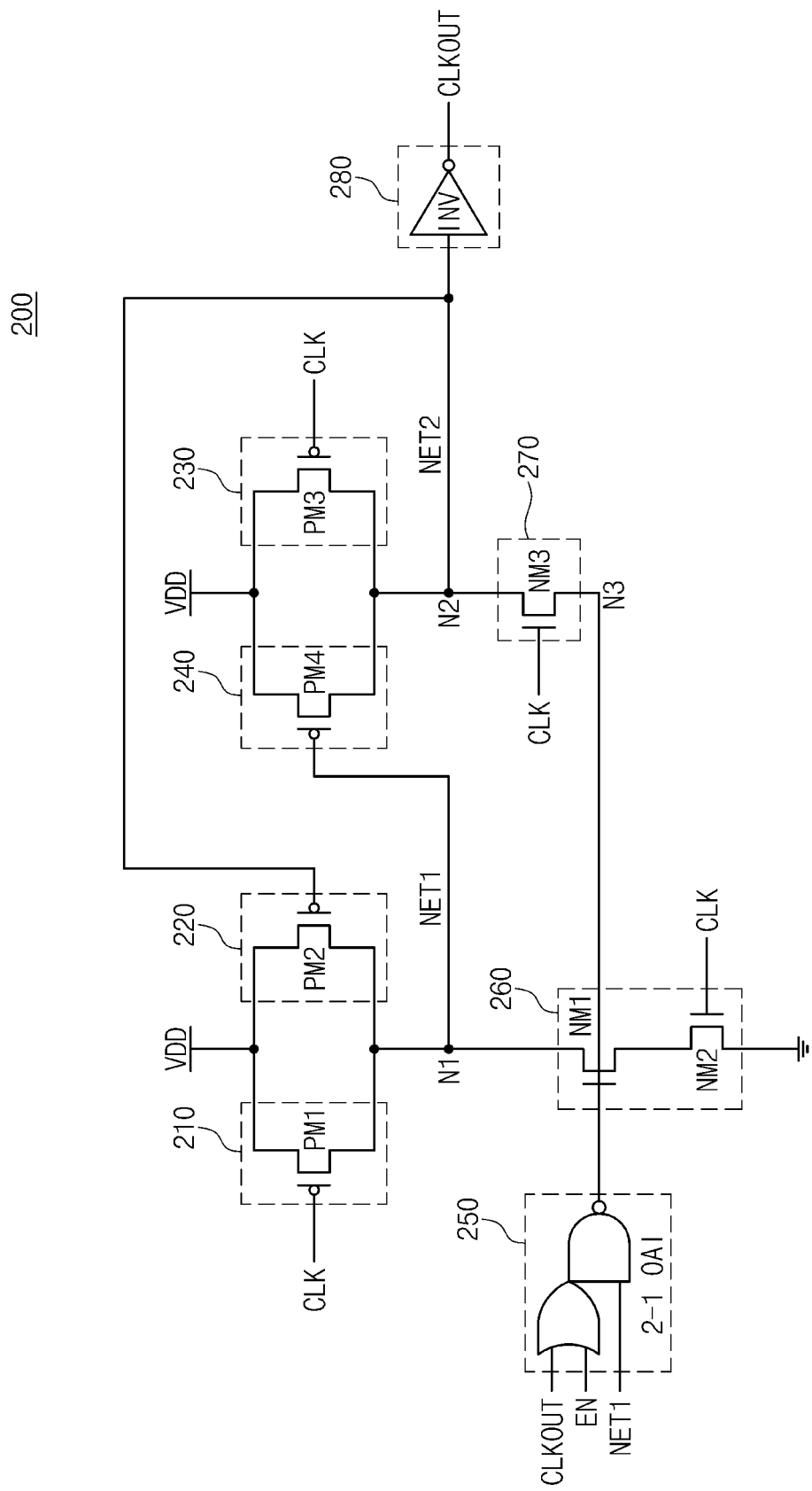
FIG. 6 illustrates a circuit diagram of a clock gating circuit of FIG. 5.

FIG. 6 illustrates a circuit diagram of a clock gating circuit of FIG. 5. Referring to FIG. 6, the control unit 250 is constituted by an OR-AND-Invert (OAI) logic circuit. The control unit 250 performs a logical operation on the clock enable signal EN, the first internal signal NET1 and the output clock signal CLKOUT to generate an output signal for controlling the first and second discharge units 260 and 270. Most operations of the clock gating circuit 200 may be the same as or similar to the clock gating circuit 100 of FIG. 2. Thus, detailed description of the clock gating circuit 200 is omitted.

The inverting circuit 280 inverts the second internal signal NET2 to generate the output clock signal CLKOUT. For example, the inverting unit 280 may be constituted by an inverter INV.

In the case that the clock signal CK has a low level, first and third PMOS transistors PM1 and PM3 are turned on. Thus, first and second nodes N1 and N2 are charged to a power supply voltage VDD. At this time, since the first internal signal NET1 has a high level and the output clock signal CLKOUT has a low level, the control unit 250 operates as an inverter inverting the clock enable signal EN. The first and second precharge units 210 and 230 respectively charge the first and second nodes N1 and N2 according to the clock signal CLK. The first and second discharge units 260 and 270 respectively discharge the first and second nodes N1 and N2 according to the clock signal CLK and a control of the control unit 250.

The control unit 250 controls the first and second discharge units 260 and 270 to discharge the first and second nodes N1 and N2 according to the clock enable signal EN. The first and second internal signals NET1 and NET2 are signals of which levels are changed according to a charge-discharge of the first and second nodes N1 and N2.

When the second internal signal NET2 is changed to a low level, the first cross-coupled maintain (CCM) unit 220 maintains the first internal signal NET1 at a high level. When the first internal signal NET1 is changed to a low level, the second cross-coupled maintain (CCM) unit 240 maintains the second internal signal NET2 at a high level.

The clock gating circuit 200 may or may not transmit the clock signal CLK according to the clock enable signal EN. The clock gating circuit 200 can reduce the number of gates between the clock enable signal EN and the output clock signal CLKOUT to reduce an electric wave delay. The clock gating circuit 200 can control the first and second discharge units 260 and 270 through the control unit 250 to reduce an error of a clock gating operation.

Figure 7:
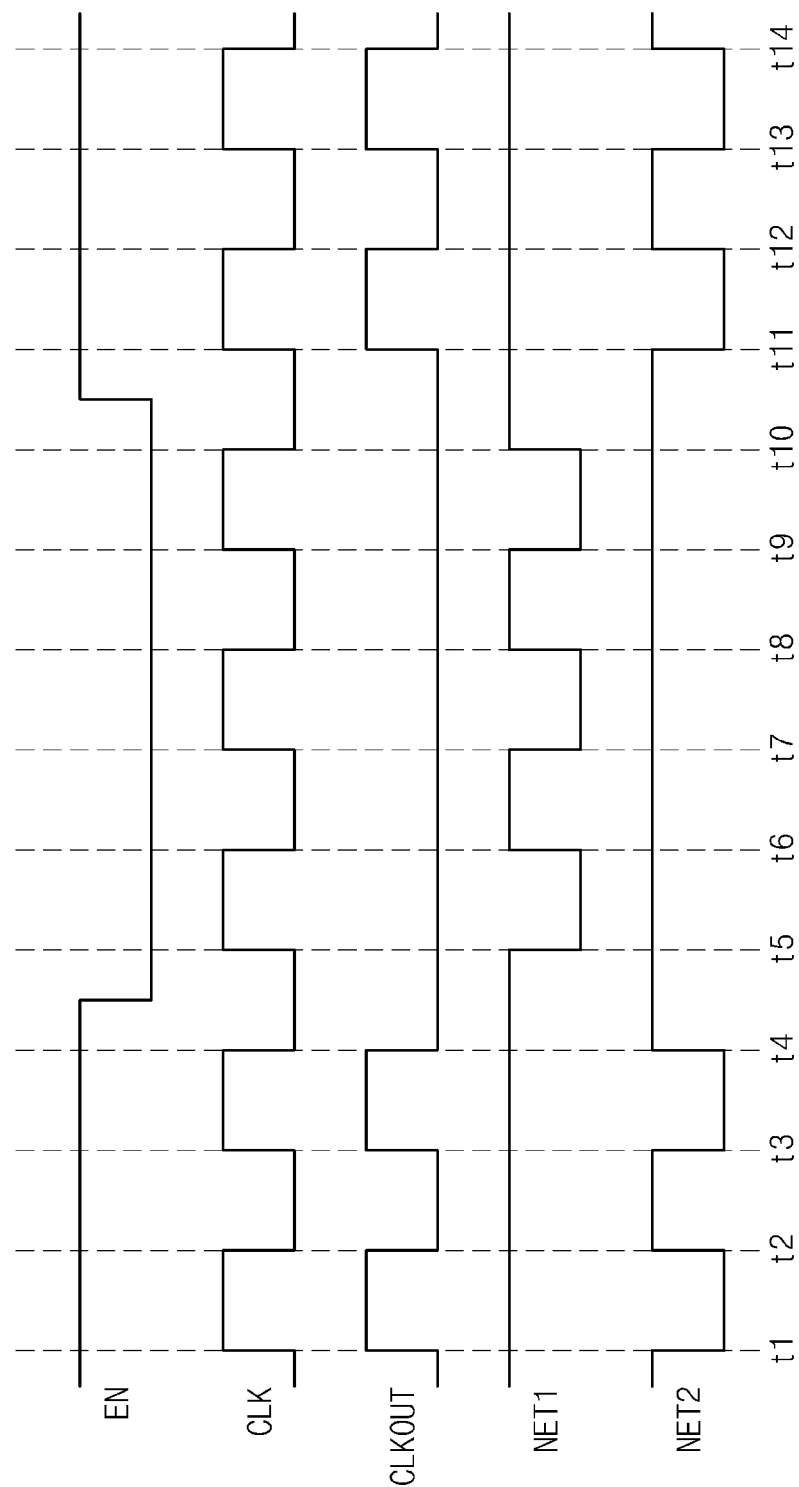
FIG. 7 illustrates a timing diagram of waveforms of signals in FIG. 6.

FIG. 7 illustrates a timing diagram of waveforms of signals in FIG. 6. Referring to FIGS. 6 and 7, the output clock signal CLKOUT is changed only when the clock enable signal EN has a high level.

Before a first time t1, since the clock signal CLK has a low level, the first and second internal signals NET1 and NET2 have a high level. During a period t1~t4 in which the clock enable signal EN has a high level, the second internal signal NET2 repeatedly switches between a low level and a high level according to the clock signal CLK. For example, if the clock signal CLK has a high level, a level of the second internal signal NET2 is low. If the clock signal CLK has a low level, a level of the second internal signal NET2 is high. At this time, the first internal signal NET1 is maintained at a high level by the first cross-coupled maintain (CCM) unit 220. The second internal signal NET2 is inverted by inverting unit 280 and output as an output clock signal CLKOUT.

Between a fourth time t4 and a fifth time t5, a level of the clock enable signal EN is changed to low. During a period t5~t10 in which the clock enable signal EN has a low level, the first internal signal NET1 repeatedly switches between a low level and a high level according to the clock signal CLK. For example, if the clock signal CLK has a high level, the first internal signal NET1 has a low level. If the clock signal CLK has a low level, the first internal signal NET1 has a high level. At this time, the second internal signal NET2 is maintained at a high level by the second cross-coupled maintain (CCM) unit 240. The second internal signal NET2 is inverted to be output as the output clock signal CLKOUT.

Thus, in the case that the clock enable signal EN is activated, an inverted clock signal CLK is transmitted as the output clock signal CLKOUT. In the case that the clock enable signal EN is deactivated, the clock signal CLK is not transmitted as the output clock signal CLKOUT.

Figure 8:
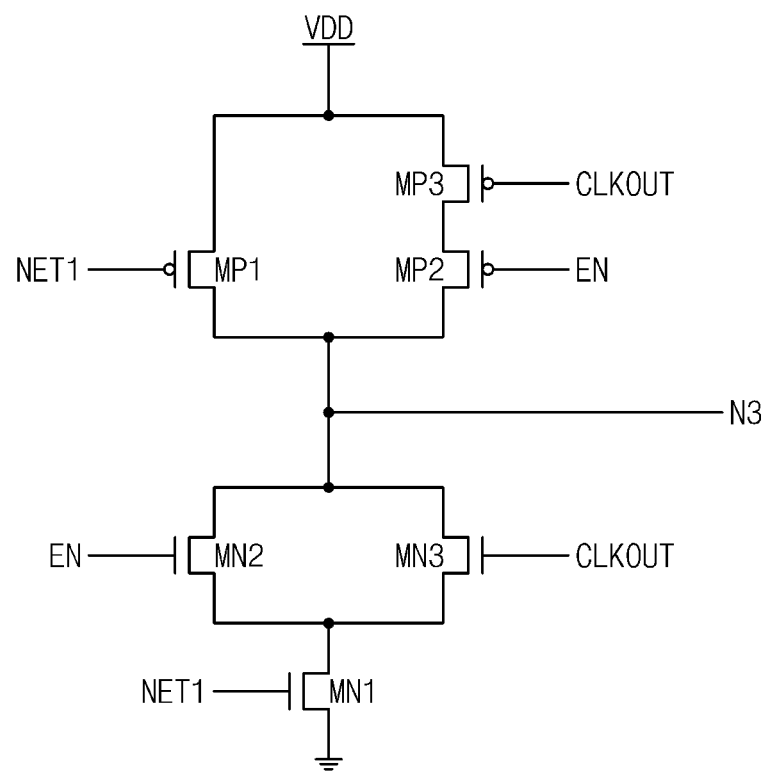
FIG. 8 illustrates a circuit diagram of a 2-1 OAI logical circuit of a control unit of FIG. 6.

FIG. 8 illustrates a circuit diagram of a 2-1 OAI logical circuit of a control unit of FIG. 6. Referring to FIGS. 6 and 8, the control unit 250 is constituted by PMOS and NMOS transistors MP1, MP2, MP3, MN1, MN2 and NM3. However, the control unit 250 is not limited thereto.

A gate of the first PMOS transistor MP1 receives the first internal signal NET1. A gate of the second PMOS transistor MP2 receives the clock enable signal EN. A gate of the third PMOS transistor MP3 receives the output clock signal CLKOUT. For example, in the case that the first internal signal NET1 has a low level, the third node N3 is charged to the power supply voltage VDD. In the case that the clock enable signal EN and the output clock signal CLKOUT have a low level, the third node N3 is also charged to the power supply voltage VDD.

A gate of the first NMOS transistor MN1 receives the first internal signal NET1. A gate of the second NMOS transistor MN2 receives the clock enable signal EN. A gate of the third NMOS transistor MN3 receives the output clock signal CLKOUT. For example, in the case that the first internal signal NET1 and the clock enable signal EN have a high level, the third node N3 is discharged to a ground voltage. In the case that the first internal signal NET1 and the output clock signal CLKOUT have a high level, the third node N3 is discharged to a ground voltage.

Thus, the control unit 250 can perform an OR operation on the clock enable signal EN and the output clock signal CLKOUT, perform an AND operation on the first internal signal NET1 and the value obtained by performing the OR operation, and then invert the AND operation result to provide the output N3.

Figure 9:
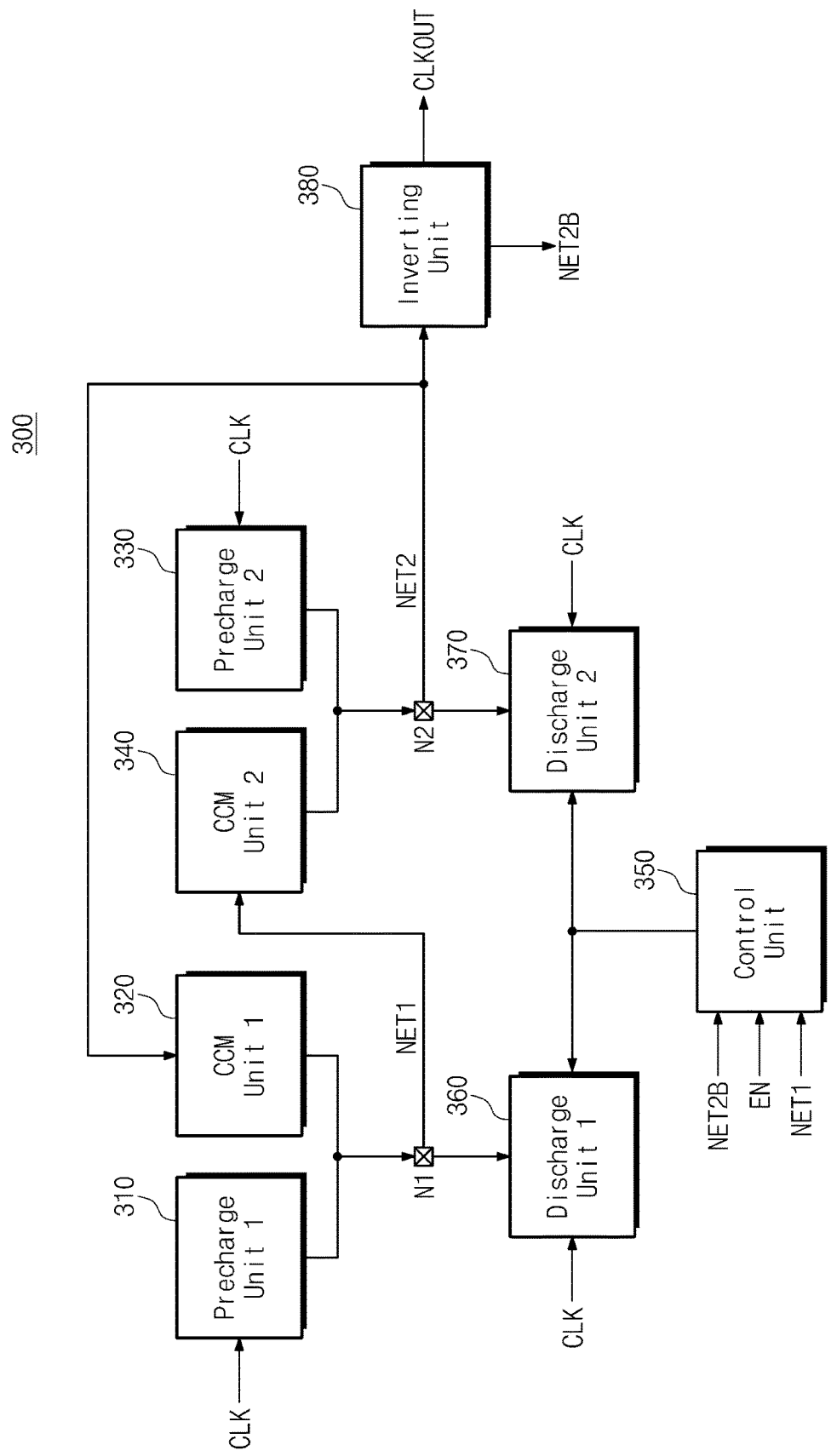
FIG. 9 illustrates a block diagram of a clock gating circuit in accordance with still another embodiment of the inventive concept.
Figure 10:
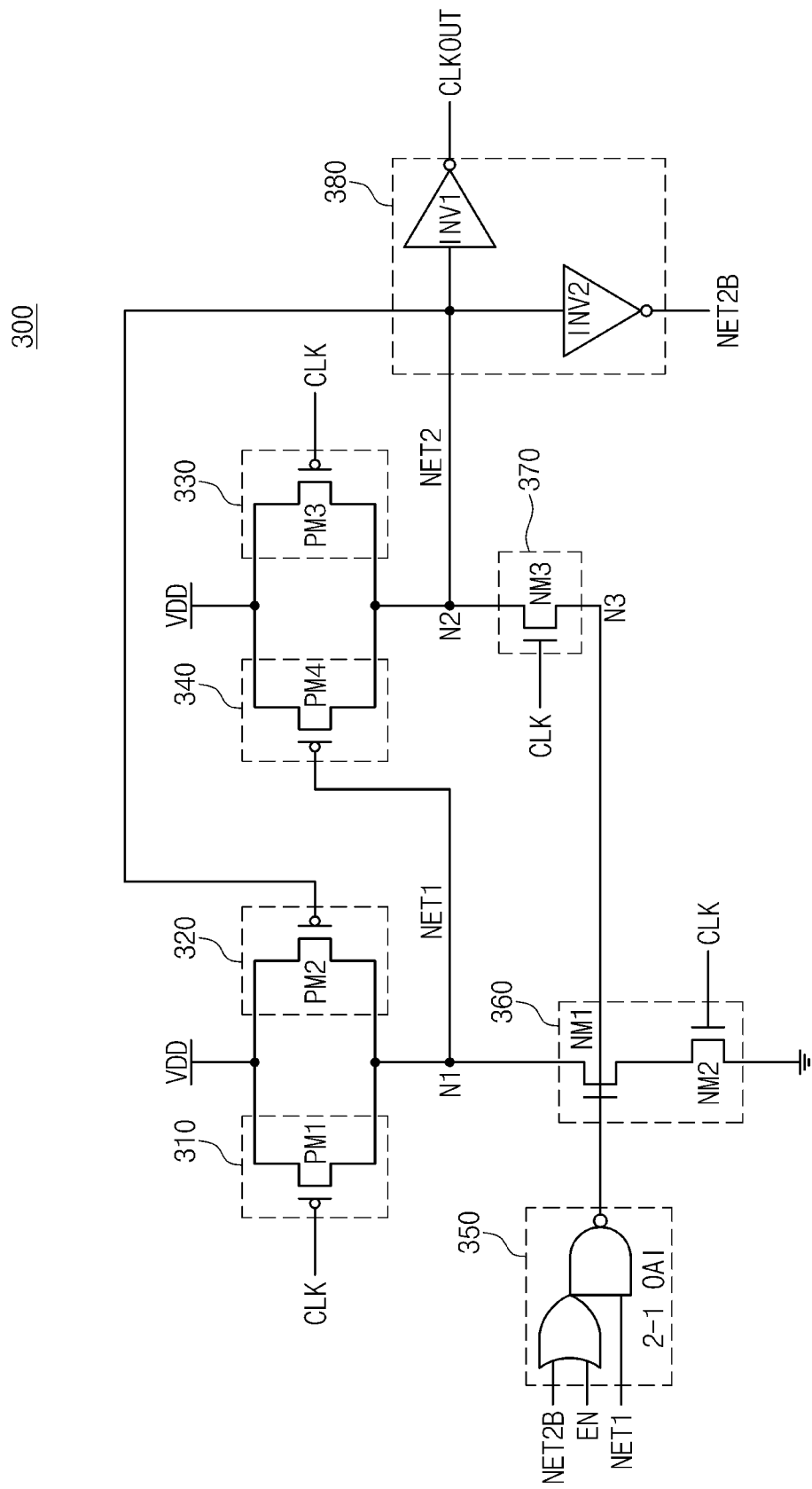
FIG. 10 illustrates a circuit diagram of a clock gating circuit of FIG. 9.
Figure 11:
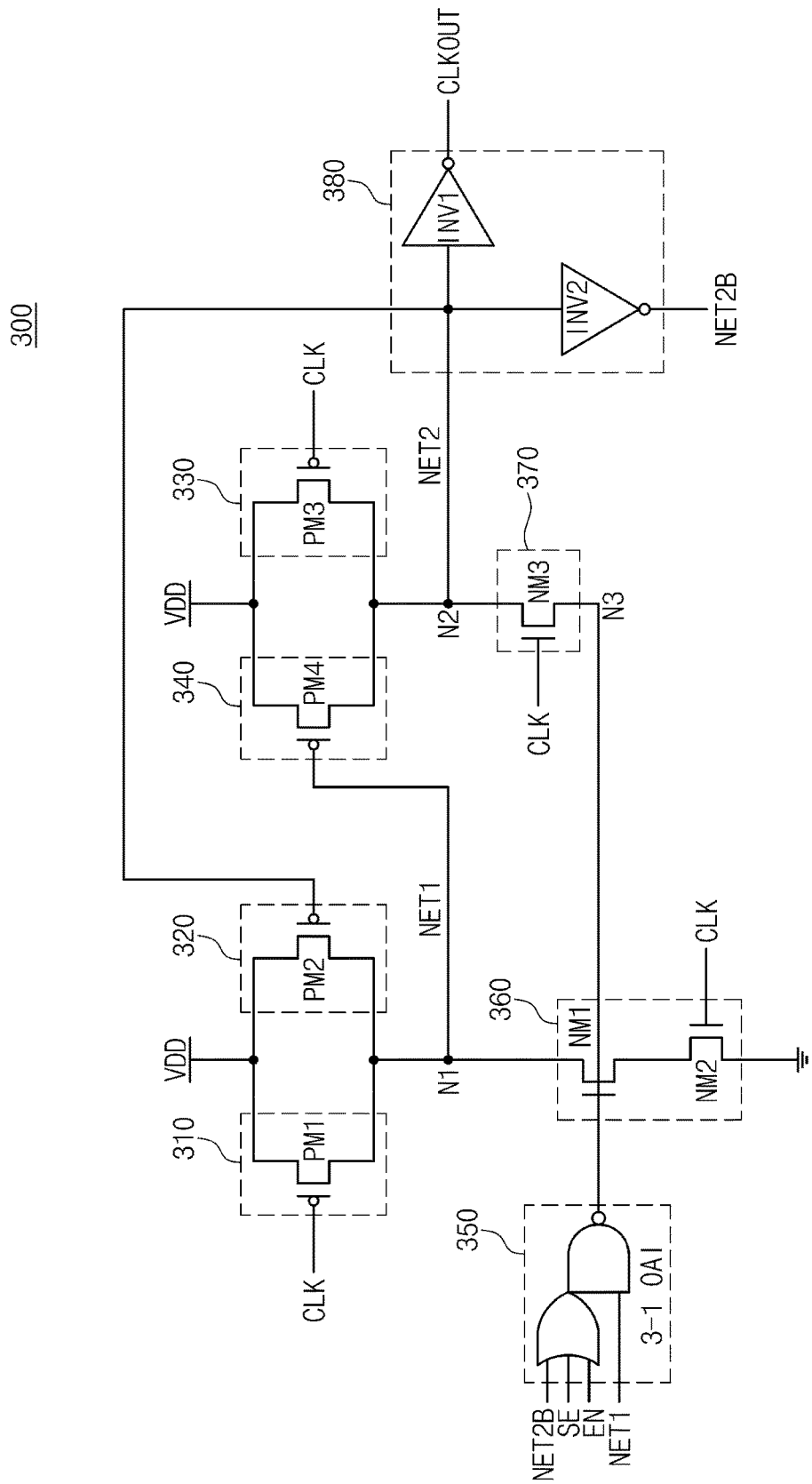
FIG. 11 illustrates a circuit diagram of a clock gating circuit in accordance with still another embodiment of the inventive concept.

FIG. 9 illustrates a block diagram of a clock gating circuit in accordance with still another embodiment of the inventive concept. FIG. 10 illustrates a circuit diagram of a clock gating circuit of FIG. 9. FIG. 11 illustrates a circuit diagram of a clock gating circuit in accordance with still another embodiment of the inventive concept. Most of the units and operations of the clock gating circuit 300 are the same as or similar to the clock gating circuit 200 of FIGS. 5 and 6. Thus, a detailed description of such similarities may be omitted from the following.

Referring to FIGS. 9 and 10, an inverting unit 380 includes first and second inverters INV1 and INV2. The first inverter INV1 inverts a second internal signal NET2 to generate an output clock signal CLKOUT. The second inverter INV2 inverts the second internal signal NET2 to generate an inverted signal NET2B (which is the second internal signal NET2 inverted). For example, the first and second inverters INV1 and INV2 may have different driving abilities from each other. The first inverter INV1 may have a driving ability greater than the second inverter INV2. The second inverter INV2 may have a driving ability greater than the first inverter INV1. A control unit 350 receives the inverted signal NET2B of the second internal signal NET2, instead of the output clock signal CLKOUT such as received by control unit 250 of clock gating circuit 200 shown in FIGS. 5 and 6.

Referring to FIG. 11, the control unit 350 is similar to the control unit 250 such as shown in FIG. 6, but however includes a 3-1 OAI logical circuit that receives a test enable signal SE in addition to inverted signal NET2B, enable signal EN and first internal signal NET1. For example, in the case that the test enable signal SE has a high level, the clock gating circuit 300 transmits a clock signal CLK as the output clock signal CLKOUT as it is regardless of a level of the clock enable signal EN. The test enable signal SE may be used to check matching between the clock signal CLK and the output clock signal CLKOUT. The test enable signal SE may be set to a low level during a clock gating operation.

Figure 12:
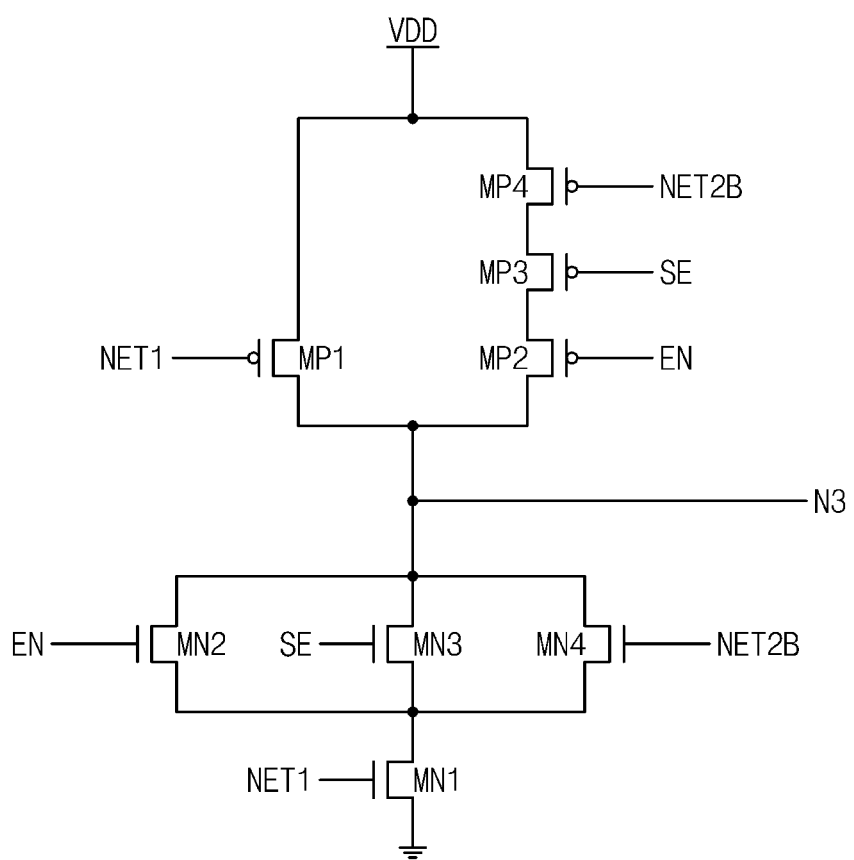
FIG. 12 illustrates a circuit diagram of an embodiment of a 3-1 OAI logical circuit of a control unit of FIG. 11.

FIG. 12 is a circuit diagram illustrating an embodiment of a 3-1 OAI logical circuit of a control unit of FIG. 11. Referring to FIGS. 11 and 12, control unit 350 is constituted by PMOS and NMOS transistors MP1~MP4 and MN1~MN4. However, the control unit 350 is not limited thereto.

A gate of first PMOS transistor MP1 receives the first internal signal NET1. A gate of second PMOS transistor MP2 receives the clock enable signal EN. A gate of third PMOS transistor MP3 receives the test enable signal SE. A gate of fourth PMOS transistor MP4 receives the inverted signal NET2B of the second internal signal NET2. For example, in the case that the first internal signal NET1 has a low level, a third node N3 is charged to a power supply voltage VDD. In the case that the clock enable signal EN, the test enable signal SE and the inverted signal NET2B of the second internal signal NET2 have a low level, the third node N3 is charged to the power supply voltage VDD.

A gate of first NMOS transistor MN1 receives the first internal signal NET1. A gate of second NMOS transistor MN2 receives the clock enable signal EN. A gate of third NMOS transistor MN3 receives the test enable signal SE. A gate of fourth NMOS transistor MN4 receives the inverted signal NET2B of the second internal signal NET2. For example, in the case that the first internal signal NET1 and the clock enable signal EN have a high level, the third node N3 is discharged to a ground voltage. In the case that the first internal signal NET1 and the test enable signal SE have a high level, the third node N3 is discharged to the ground voltage. In the case that the first internal signal NET1 and the inverted signal NET2B of the second internal signal NET2 have a high level, the third node N3 is discharged to the ground voltage.

Thus, the control unit 350 performs an OR operation on the clock enable signal EN, the test enable signal SE and the inverted signal NET2B of the second internal signal, performs an AND operation on the first internal signal NET1 and the value obtained by performing the OR operation, and then inverts the AND operation result to provide the output N3.

Figure 13:
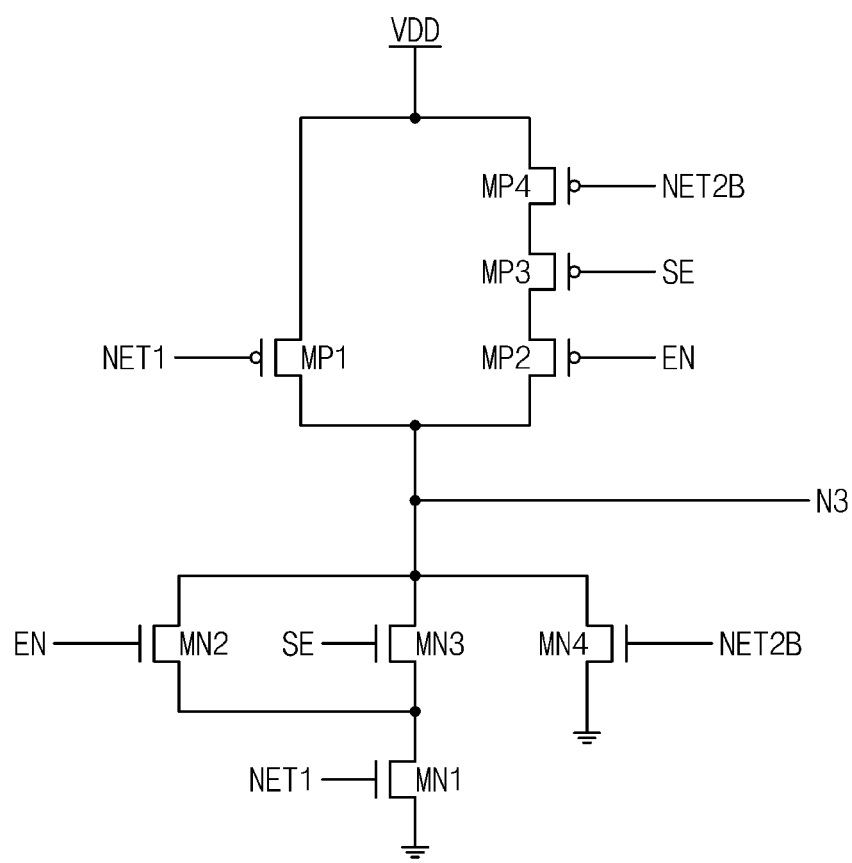
FIG. 13 illustrates a circuit diagram of another embodiment of a 3-1 OAI logical circuit of a control unit of FIG. 11.
Figure 14:
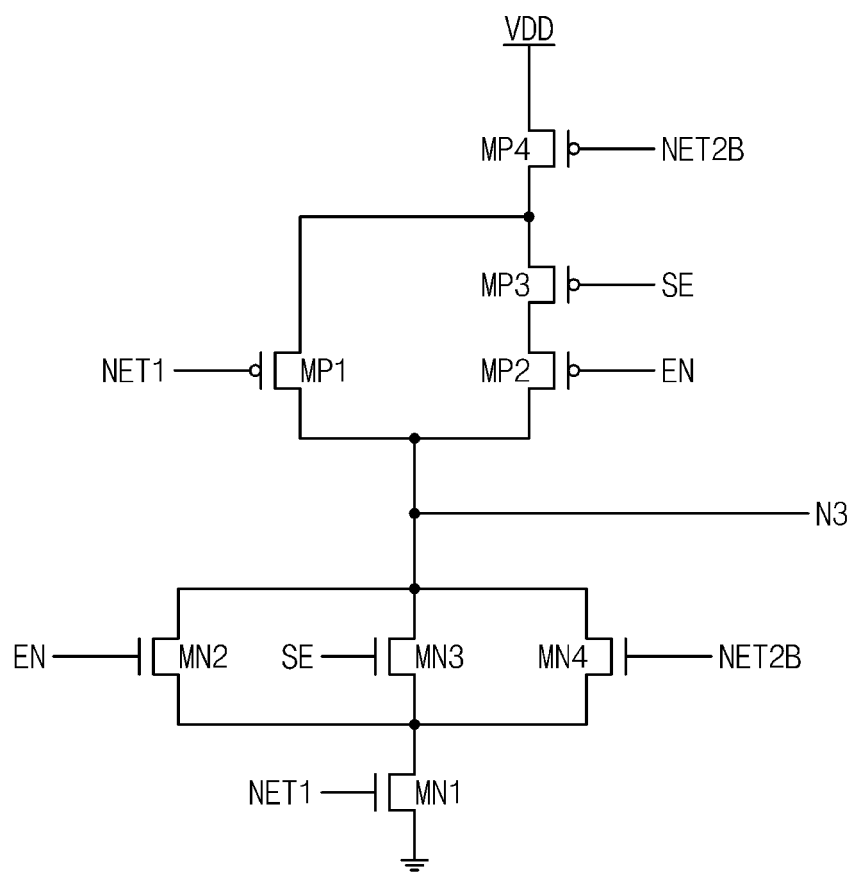
FIG. 14 illustrates a circuit diagram of still another embodiment of a 3-1 OAI logical circuit of a control unit of FIG. 11.
Figure 15:
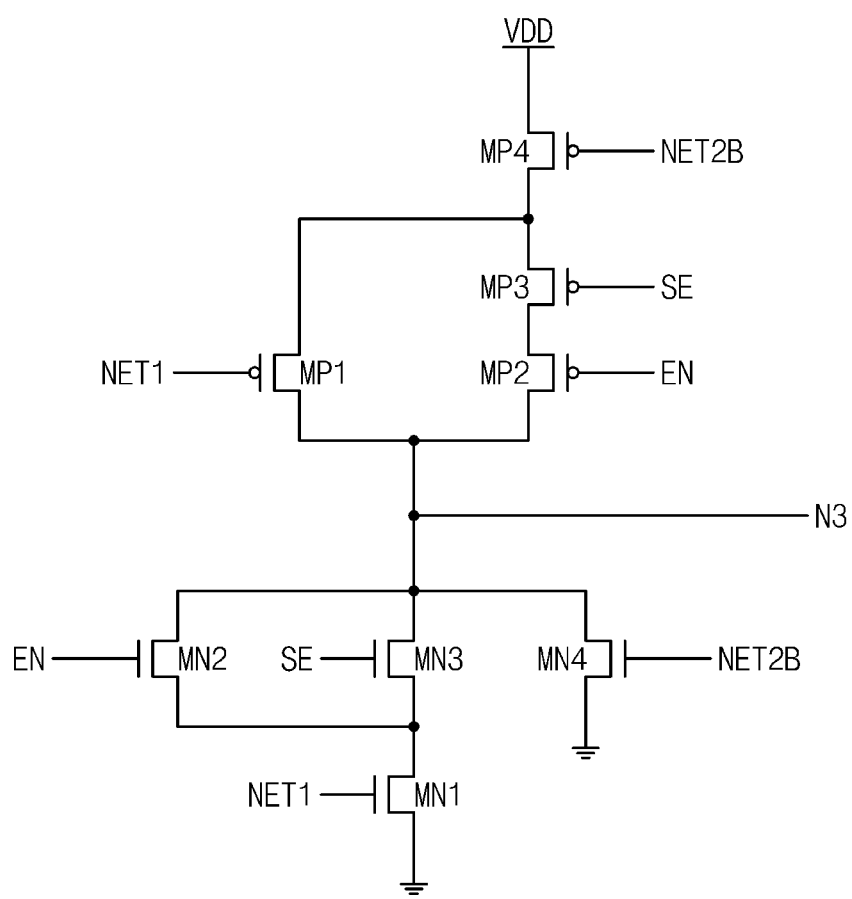
FIG. 15 illustrates a circuit diagram of yet another embodiment of a 3-1 OAI logical circuit of a control unit of FIG. 11.

FIG. 13 illustrates a circuit diagram of another embodiment of a 3-1 OAI logical circuit of a control unit of FIG. 11. FIG. 14 illustrates a circuit diagram of still another embodiment of a 3-1 OAI logical circuit of a control unit of FIG. 11. FIG. 15 illustrates a circuit diagram of yet another embodiment of a 3-1 OAI logical circuit of a control unit of FIG. 11. The circuits shown in FIGS. 13, 14 and 15 are each respectively constituted by PMOS and NMOS transistors MP1~MP4 and MN1~MN4 including gates connected to the various signals such as shown in FIG. 12.

Referring to FIG. 13, the fourth NMOS transistor MN4 is connected between the third node N3 and a ground node. Referring to FIG. 14, one end of the first PMOS transistor MP1 is connected to the third node N3 and the other end of the first PMOS transistor MP1 is connected to one end of each of the third and fourth PMOS transistors MP3 and MP4. Referring to FIG. 15, the control unit 350 is implemented by combining the configurations of FIGS. 13 and 14. For example, the fourth NMOS transistor MN4 is connected between the third node N3 and the ground node. One end of the first PMOS transistor MP1 is connected to the third node N3 and the other end of the first PMOS transistor MP1 is connected to one end of each of the third and fourth PMOS transistors MP3 and MP4.

Figure 16:
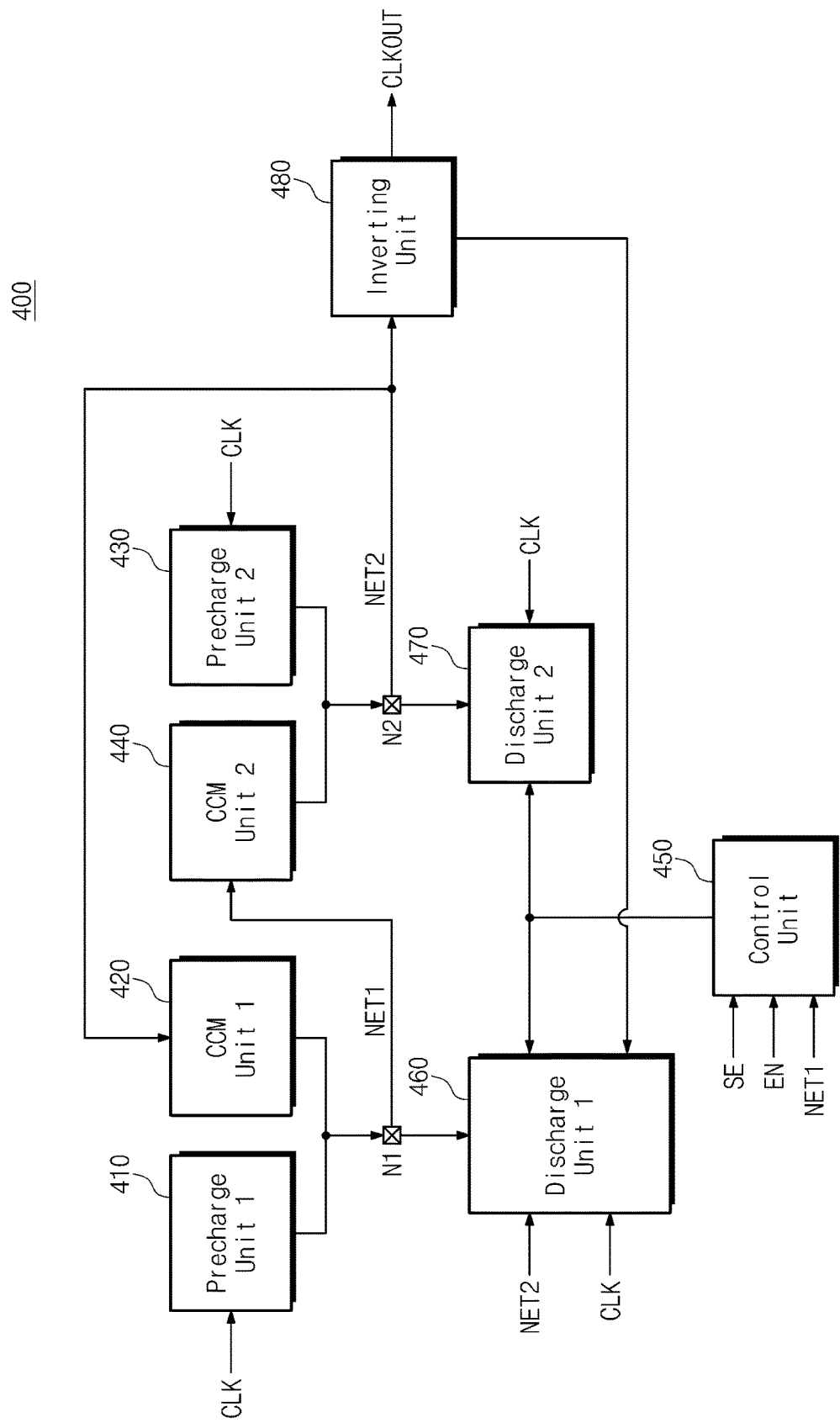
FIG. 16 illustrates a block diagram of a clock gating circuit in accordance with yet another embodiment of the inventive concept.
Figure 17:
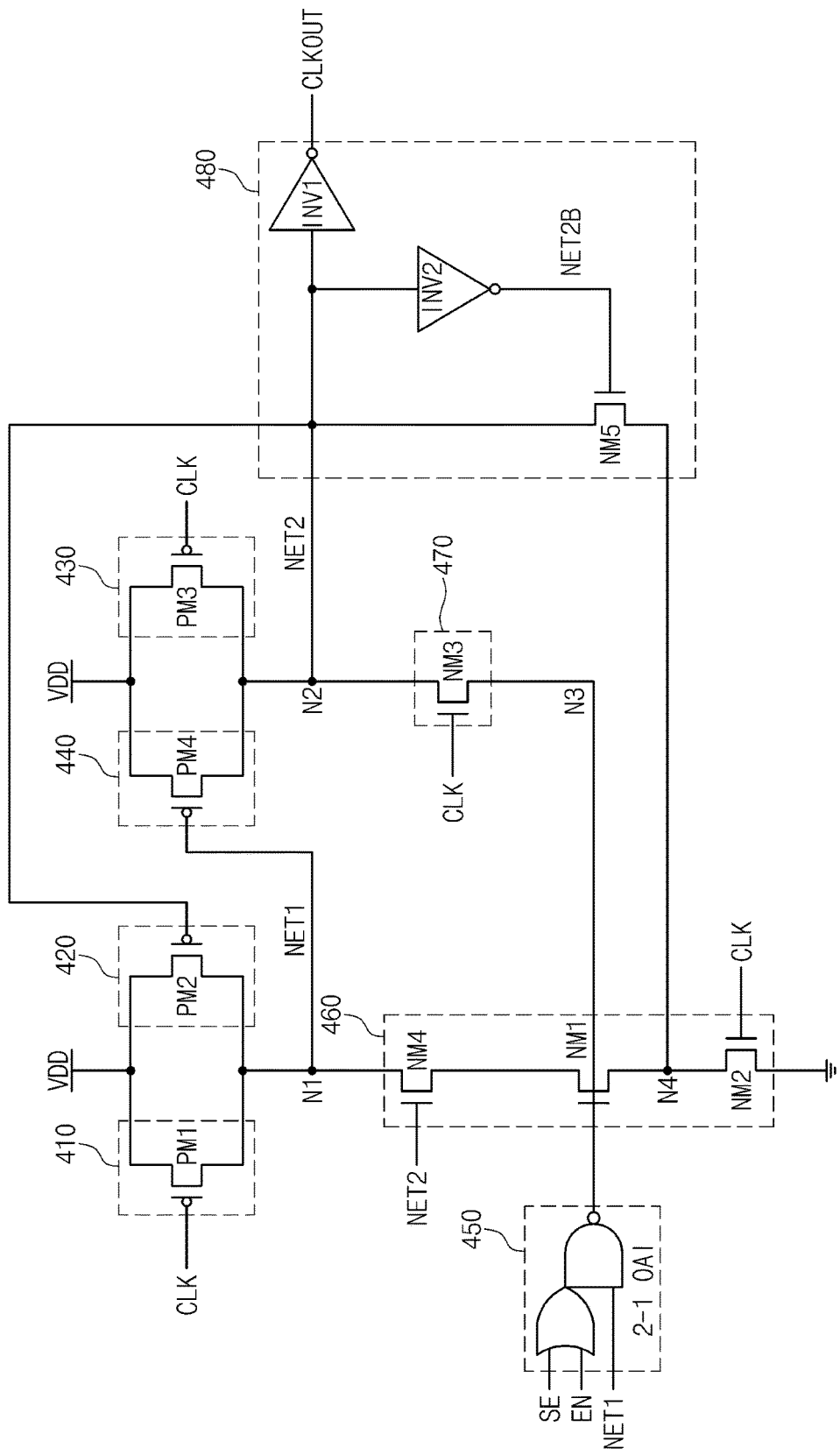
FIG. 17 illustrates a circuit diagram of a clock gating circuit of FIG. 16.
Figure 18:
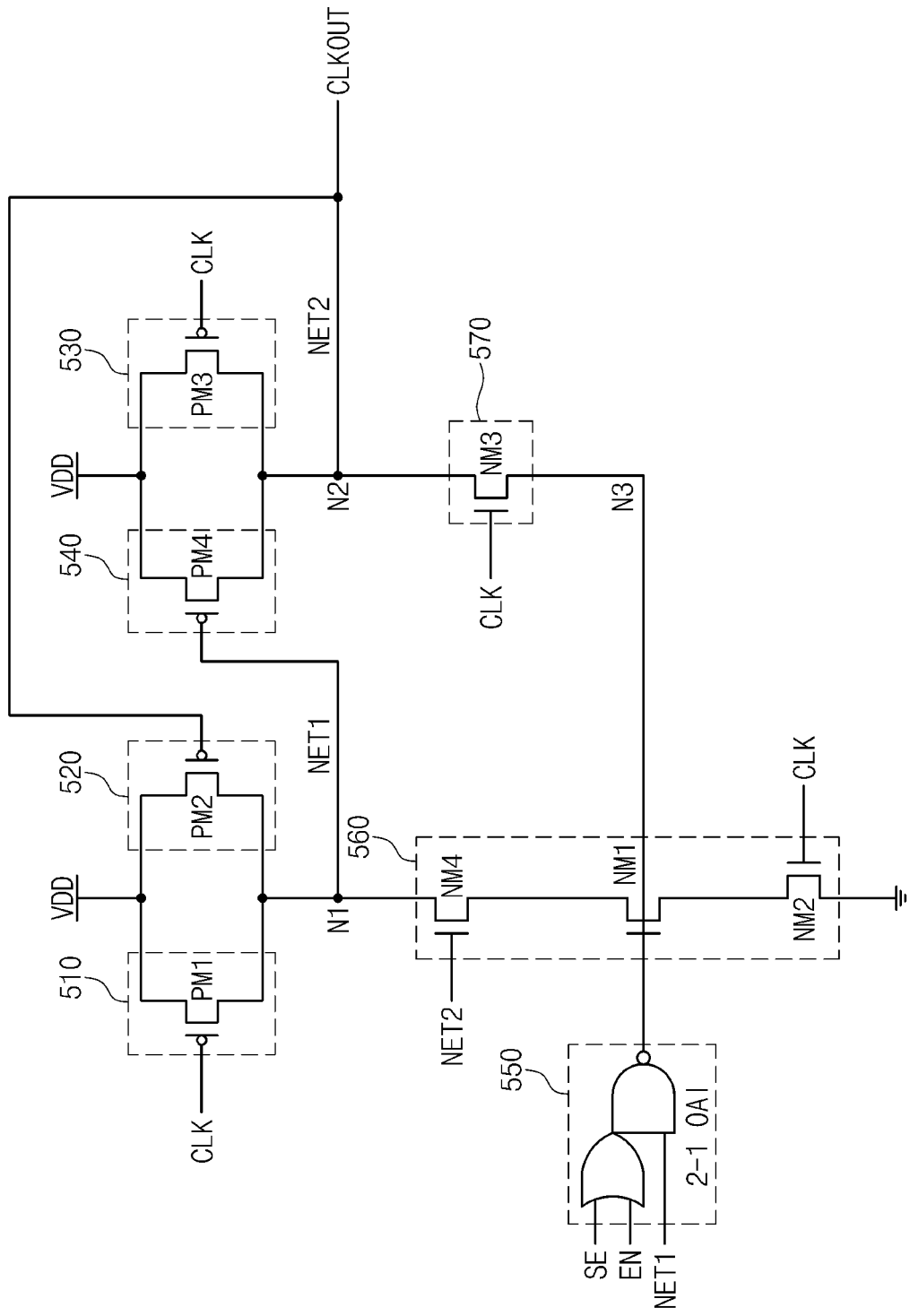
FIG. 18 illustrates a circuit diagram of a clock gating circuit in accordance with yet another embodiment of the inventive concept.

FIG. 16 illustrates a block diagram of a clock gating circuit in accordance with yet another embodiment of the inventive concept. FIG. 17 illustrates a circuit diagram of a clock gating circuit of FIG. 16. FIG. 18 illustrates a circuit diagram of a clock gating circuit in accordance with yet another embodiment of the inventive concept. Most constitutions and operations of the clock gating circuits 400 and 500 are the same as or similar to the clock gating circuit 300 of FIGS. 9 through 11. Thus, a detailed description of such similar constitutions and operations may be omitted from the following.

Referring to FIGS. 16 and 17, an inverting unit 480 includes first and second inverters INV1 and INV2 and a fifth NMOS transistor NM5. The first inverter INV1 inverts a second internal signal NET2 to generate an output clock signal CLKOUT. The second inverter INV2 inverts the second internal signal NET2 to generate an inverted signal NET2B (which is the second internal signal NET2 inverted). For example, the first and second inverters INV1 and INV2 may have different driving abilities from each other. The first inverter INV1 may have a driving ability greater than the second inverter INV2. The second inverter INV2 may have a driving ability greater than the first inverter INV1.

A fifth NMOS transistor NM5 is connected between a second node N2, and a fourth node N4 located at an interconnection between first NMOS transistor MN1 and second NMOS transistor NM2 of first discharge unit 460, to assist a discharge of the second node N2. For example, when the second internal signal NET2 has a low level, a high level is input to a gate of the fifth NMOS transistor NM5 and thereby the fifth NMOS transistor NM5 is turned on. Thus, the second node N2 may be definitely discharged through the fifth NMOS transistor NM5. As a result, the second internal signal NET2 may have a waveform that is obviously distinguished between a high level and a low level. Consequently, a waveform of the output clock signal CLKOUT may become clearer.

A control unit 450 receives a test enable signal SE, a clock enable signal EN and a first internal signal NET1. The control unit 450 controls first and second discharge units 460 and 470 through a logic operation of the test enable signal SE, the clock enable signal EN and the first internal signal NET1.

The first discharge unit 460 includes first, second and fourth NMOS transistors NM1, NM2 and NM4. The second internal signal NET2 is input to a gate of the fourth NMOS transistor NM4. For example, while the second internal signal NET2 is maintained at a high level, since a first node N1 is discharged according to a clock signal CLK, in the case that the clock enable signal EN has a low level and the second internal signal NET2 has a high level, the first discharge unit 460 can discharge the first node N1 to a ground voltage.

Referring to FIG. 18, most constitutions and operations of the clock gating circuit 500 is the same as or similar to the clock gating circuit 400 of FIG. 17, except that an inverting unit such as inverting unit 480 of FIG. 17 is not included. Thus, the clock gating circuit 500 may have a smaller area compared with the clock gating circuit 400 of FIG. 17. The output clock signal CLKOUT may be an inverted waveform of the clock signal CLK. However, the output clock signal CLKOUT may be inverted to be used in a functional block receiving the output clock signal CLKOUT.

Figure 19:
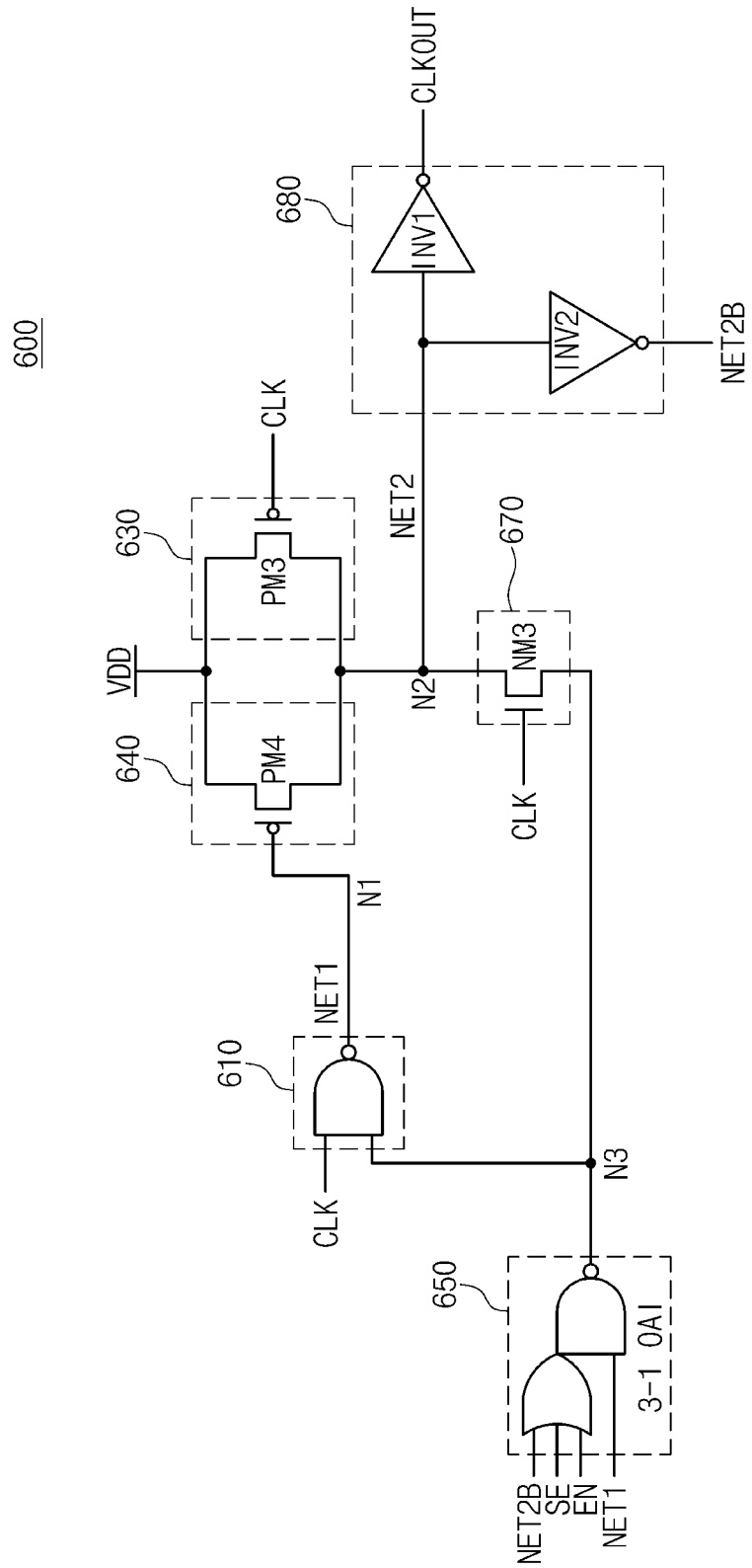
FIG. 19 illustrates a circuit diagram of a clock gating circuit in accordance with still yet another embodiment of the inventive concept.

FIG. 19 illustrates a circuit diagram of a clock gating circuit in accordance with still yet another embodiment of the inventive concept. A constitution and an operation of a clock gating circuit 600 are the same or similar to those of the clock gating circuit 300 of FIG. 11. Thus, detailed description of such similar constitution and operation thereof are omitted from the following.

Referring to FIG. 19, the clock gating circuit 600 includes a NAND gate circuit 610. For example, the NAND gate circuit 610 receive a clock signal CLK and an output signal of a control unit 650. The NAND gate circuit 610 generates a first internal signal NET1 based on the clock signal CLK and the output signal of the control unit 650. The NAND gate circuit 610 performs the function of first precharge unit 310 and first cross-coupled maintain unit 320 of FIG. 11 equally. That is, the NAND gate circuit 610 provides the first internal signal NET1 to a second cross-coupled maintain unit 640.

Figure 20:
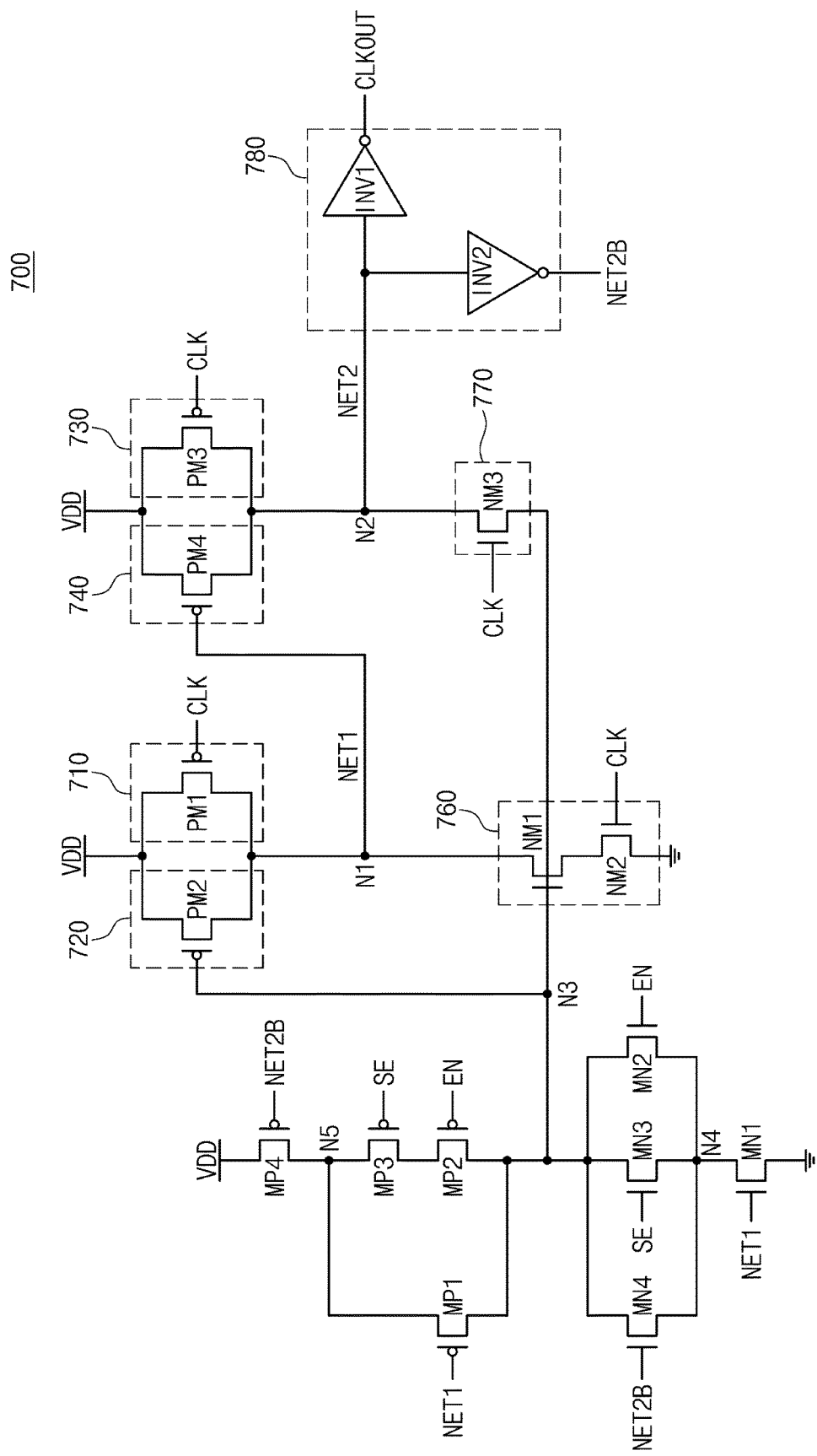
FIG. 20 illustrates a circuit diagram of a NAND gate circuit and a control unit of FIG. 19 at the transistor level.

FIG. 20 illustrates a circuit diagram of a NAND gate circuit and a control unit of FIG. 19 at the transistor level. Referring to FIG. 20, the NAND gate circuit 610 of FIG. 19 may be expressed in FIG. 20 by a first precharge unit 710, a first cross-coupled maintain unit 720 and a first discharge unit 760. For example, the first precharge unit 710 charges a first node N1 to a power supply voltage VDD according to a clock signal CLK. The first cross-coupled maintain unit 720 charges the first node N1 to the power supply voltage VDD according to a voltage level of a third node N3. The first discharge unit 760 discharges the first node N1 according to the clock signal CLK and the voltage level of the third node N3.

As described above, the first precharge unit 710 and a second precharge unit 730 can charge the first node N1 and a second node N2 respectively according to the clock signal CLK. The first discharge unit 760 and a second discharge unit 770 can discharge the first node N1 and the second node N2 respectively according to the clock signal CLK and a control of a control unit 750.

The control unit of FIG. 20 which is shown as constituted by PMOS and NMOS transistors MP1~MP4 and MN1~MN4 controls the first and second discharge units 760 and 770 to discharge the first node N1 or the second node N2 according to a clock enable signal EN. The first internal signal NET1 and a second internal signal NET2 are signals of which levels are changed depending on a charge or discharge of the first and second nodes N1 and N2.

When the voltage level of the third node N3 is changed to a low level, the first cross-coupled maintain unit 720 maintains the first internal signal NET1 at a first level. When the first internal signal NET1 is changed to a low level, a second cross-coupled maintain unit 740 maintains the second internal signal NET2 at the first level.

The clock gating circuit 700 may or may not transmit the clock signal CLK depending on the clock enable signal EN. The clock gating circuit 700 can reduce the number of gates between the clock enable signal EN and an output clock signal CLKOUT, to reduce a propagation delay. The clock gating circuit 700 can also control the first and second discharge units 760 and 770 through the control unit constituted by PMOS and NMOS transistors MP1~MP4 and MN1~MN4, to reduce an error of a clock gating operation.

Figure 21:
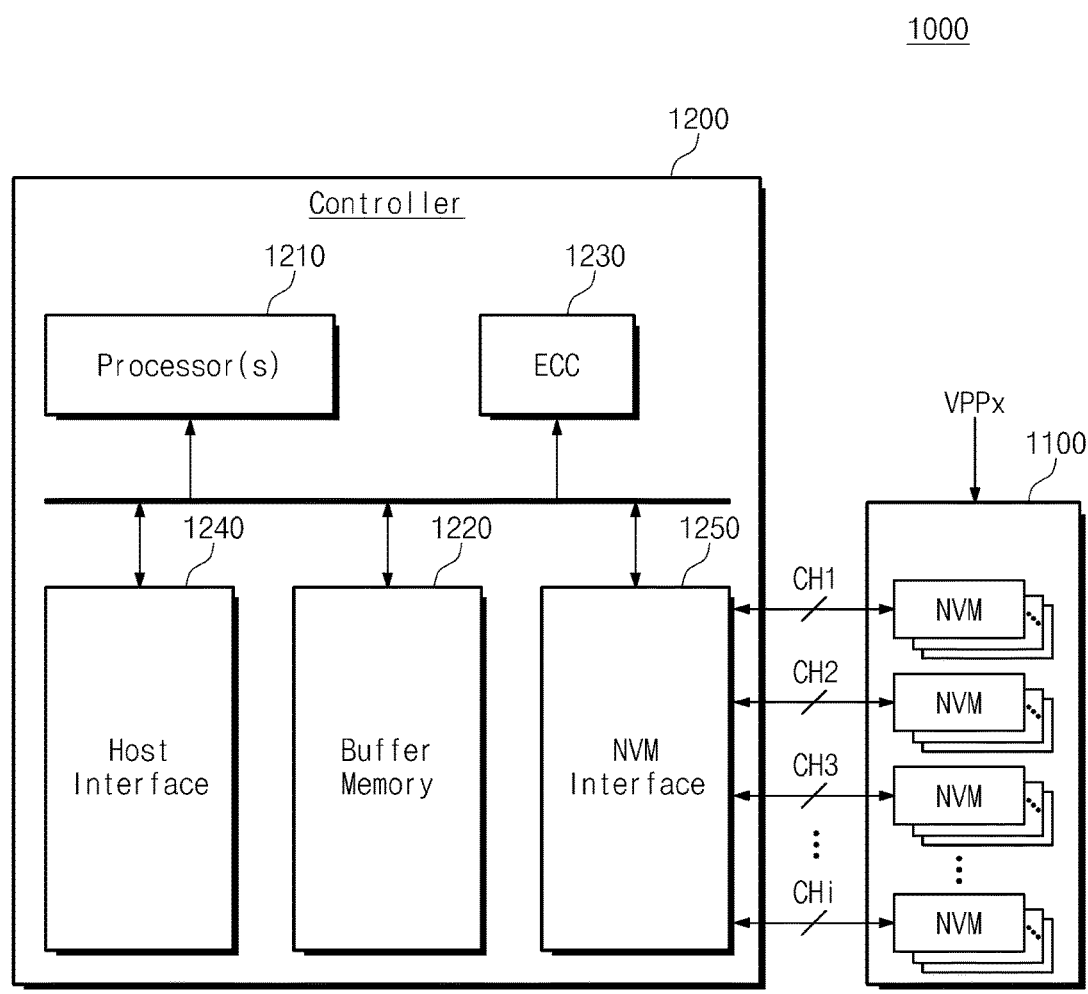
FIG. 21 illustrates a block diagram of a solid-state drive (SSD) including a clock gating circuit of the inventive concept.

FIG. 21 illustrates a block diagram of a solid-state drive (SSD) including a clock gating circuit of the inventive concept. Referring to FIG. 21, an SSD 1000 includes a plurality of nonvolatile memory devices 1100 and an SSD controller 1200. The nonvolatile memory devices 1100 may be implemented to selectively receive an external high voltage VPPx.

The SSD controller 1200 is connected to the nonvolatile memory devices 1100 through a plurality of channels CH1~Chi, (i is an integer 2 or more). The SSD controller 1200 includes at least one processor 1210, a buffer memory 1220, an error correction circuit 1230, a host interface 1240, and a nonvolatile memory interface 1250.

The at least one processor 1210 can control an overall operation of the SSD controller 1200. The at least one processor 1210 may include a plurality of functional blocks.

The at least one processor 1210 may include the clock gating circuit described in FIGS. 1 through 20 to reduce power consumption and operate at high speed.

The buffer memory 1220 temporarily stores data needed to drive the memory controller 1200. The buffer memory 1220 may include a plurality of memory cells storing data or a command.

The error correction circuit 1230 can calculate an error correction code value of data to be programmed in a write operation, correct an error data read in a read operation based on the error correction code value and correct an error of data restored from the nonvolatile memory device 1100 in a data restoration operation. Although not illustrated in the drawing, a code memory storing code data needed to drive the SSD controller 1200 may be further included. The code memory may be implemented by a nonvolatile memory device.

Figure 22:
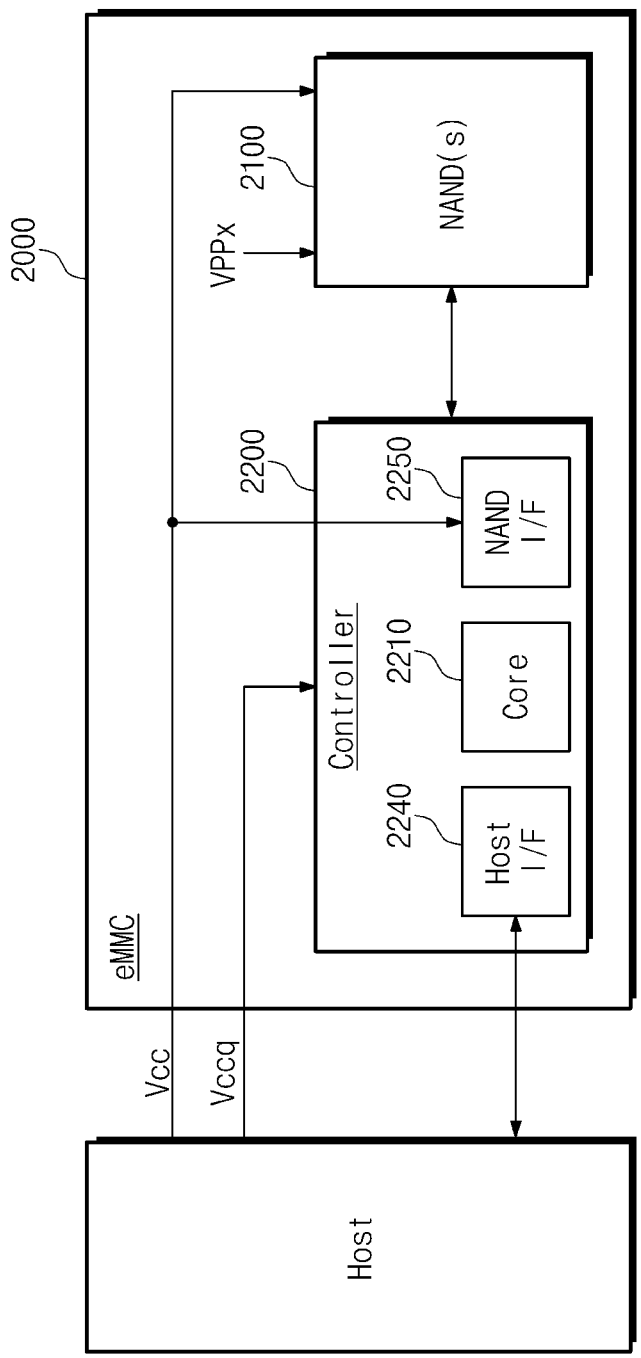
FIG. 22 illustrates a block diagram of an embedded multimedia card (eMMC) including a clock gating circuit of the inventive concept.

FIG. 22 illustrates a block diagram of an embedded multimedia card (eMMC) including a clock gating circuit of the inventive concept. Referring to FIG. 22, an eMMC 2000 includes at least one NAND flash memory device 2100 and a controller 2200.

The NAND flash memory device 2100 may be a single data rate (SDR) NAND or a double data rate (DDR) NAND. The NAND flash memory device 2100 may be a vertical NAND (VNAND) flash memory device.

The controller 2200 may be connected to the NAND flash memory device 2100 through a plurality of channels. The controller 2200 includes at least one controller core 2210, a host interface 2240 and a NAND interface 2250.

The at least one controller core 2210 may include a plurality of functional blocks. At least one controller core 2210 may include the clock gating circuit described in FIGS. 1 through 20 to reduce power consumption and operate at high speed.

The host interface 2240 may perform an interfacing between the controller 2200 and a host. The NAND interface 2250 performs an interfacing between the NAND flash memory device 2100 and the controller 2200. In an embodiment, the host interface 2240 may be a parallel interface (e.g., a MMC interface). In another embodiment, the host interface 2240 may be a serial interface (e.g., UHS-II, UFS interface).

The eMMC 2000 may receive power supply voltages Vcc and Vccq from the host. A first power supply voltage Vcc (e.g., 3.3V) may be provided to the NAND flash device 2100 and the NAND interface 2250, and a second power supply voltage Vccq (e.g., 1.8V/3.3V) may be provided to the controller 2200. In an embodiment, the eMMC 2000 may selectively receive an external high voltage VPPx.

Figure 23:
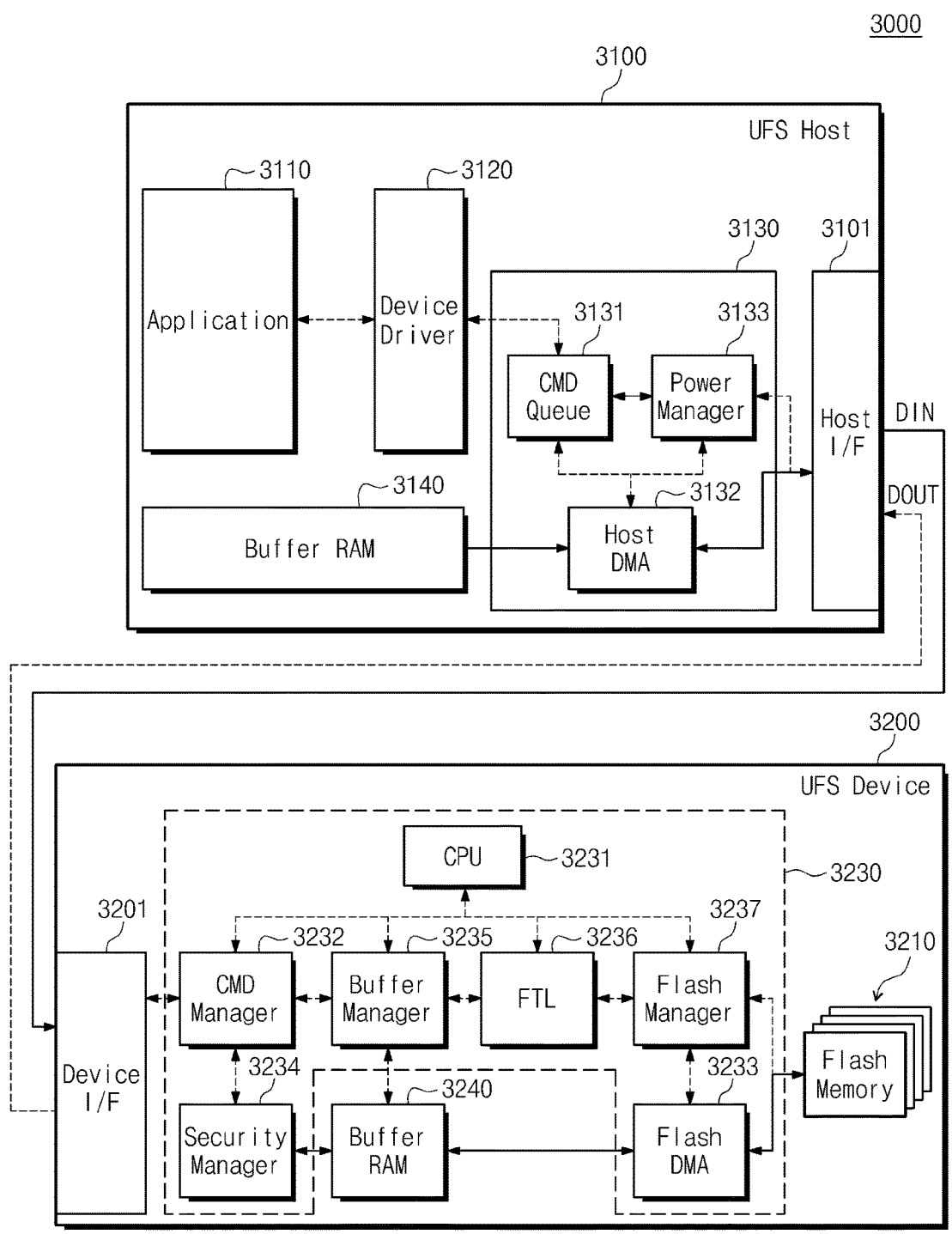
FIG. 23 illustrates a block diagram of a universal flash storage (UFS) system including a clock gating circuit of the inventive concept.

FIG. 23 illustrates a block diagram of a universal flash storage (UFS) including a clock gating circuit of the inventive concept. Referring to FIG. 23, a UFS system 3000 includes a UFS host 3100 and a UFS device 3200.

The UFS host 3100 includes an application 3110, a device driver 3120, a host controller 3130, and a buffer RAM 3140. The host controller 3130 includes a command queue 3131, a host DMA 3132, and a power manager 3133. The command queue 3131, the power manager 3133 and the host DMA 3132 may operate in algorithm, software, or firmware in the host controller 3130.

Commands (e.g., write command) generated from the application 3110 and the device driver 3120 of the UFS host 3100 may be input to the command queue 3131 of the host controller 3130. The command queue 3131 can sequentially store a command to be provided to the UFS device 3200. The command stored in the command queue 3131 may be provided to the host DMA 3132. The host DMA 3132 sends a command to the UFS device 3200 through the host interface 3101.

Referring to FIG. 23, the UFS device 3200 includes a flash memory 3210, a device controller 3230, and a buffer RAM 3240. The device controller 3230 includes a central processing unit (CPU) 3231, a command manager 3232, a flash DMA 3233, a security manager 3234, a buffer manager 3235, a flash translation layer (FTL) 3236, and a flash manager 3237. The command manager 3232, the security manager 3234, the buffer manager 3235, the flash translation layer (FTL) 3236 and the flash manager 3237 may operate in algorithm, software, or firmware in the device controller 3230.

The central processing unit (CPU) 3231 can control an overall operation of the UFS device 3200. The central processing unit (CPU) 3231 may include a plurality of functional blocks. The central processing unit (CPU) 3231 may include the clock gating circuit described in FIGS. 1 through 20 to reduce power consumption and operate at high speed.

A command inputted from the UFS host 3100 to the UFS device 3200 may be provided to the command manager 3232 through the device interface 3201. The command manager 3232 interprets a command provided from the UFS host 3100 and authenticates the inputted command using the security manager 3234. The command manager 3232 can allocate the buffer RAM 3240 to receive data through the buffer manager 3235. If a data transmission preparation is completed, the command manager 3232 sends a RTT (ready_to_transfer) UFS protocol information unit (UPIU) to the UFS host 3100.

The UFS host 3100 can transmit data to the UFS device 3200 in response to the RTT (ready_to_transfer) UPIU. The data may be transmitted to the UFS device 3200 through the host DMA 3132 and the host interface 3101. The UFS device 3200 can store the provided data in the buffer RAM 3240 through the buffer manager 3235. The data stored in the buffer RAM 3240 may be provided to the flash manager 3237 through the flash DMA 3233. The flash manager 3237 can store data in a selected address of the flash memory 3210 with reference to address mapping information of the flash translation layer 3236.

If a data transmission and a program that are necessary for a command are completed, the UFS device 3200 sends a response to the UFS host 3100 through an interface and notifies a command completion. The UFS host 3100 notifies the device driver 3120 and the application 3110 of whether the command is completed and can finish an operation with respect to a corresponding command.

Figure 24:
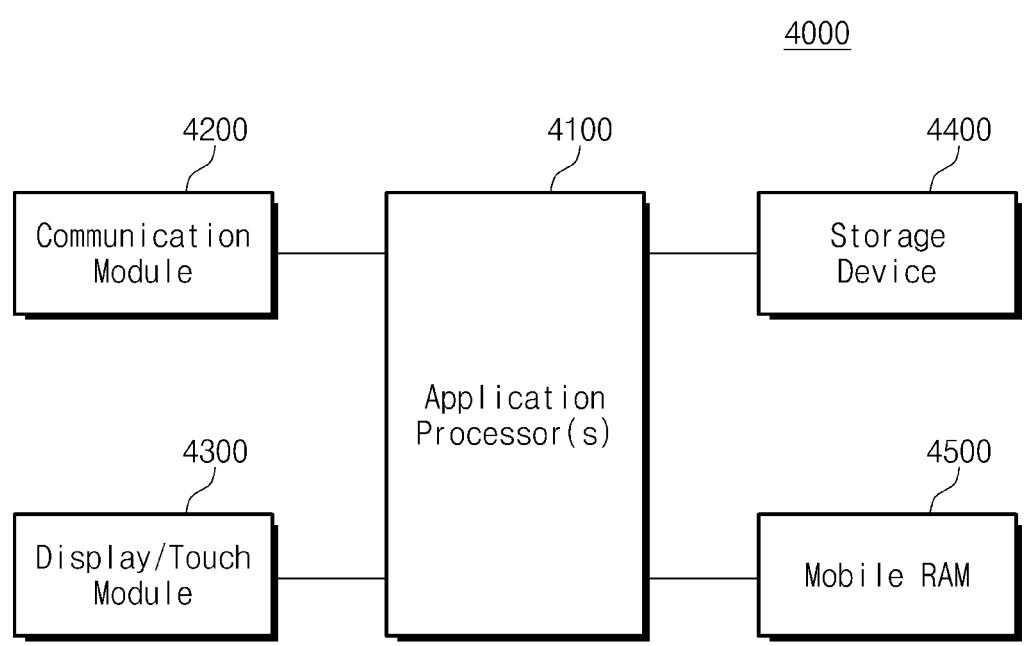
FIG. 24 illustrates a block diagram of a mobile device including a clock gating circuit of the inventive concept.

FIG. 24 illustrates a block diagram of a mobile device including a clock gating circuit of the inventive concept. Referring to FIG. 24, a mobile device 4000 includes an application processor 4100, a communication module 4200, a display/touch module 4300, a storage device 4400 and a mobile RAM 4500.

The application processor 4100 can control an overall operation of the mobile device 4000. The application processor 4100 may include a plurality of functional blocks. The application processor 4100 may include the clock gating circuit described in FIGS. 1 through 20 to reduce power consumption and operate at high speed.

The communication module 4200 may be implemented to control a wired/wireless communication with the outside. The display/touch module 4300 may be implemented to display data processed in the application processor 4100 or to receive data from the touch panel. The storage device 4400 may be implemented to store data of a user. The storage device 4400 may be an eMMC, a SSD, a UFS device. The mobile RAM 4500 may be implemented to temporarily store data necessary for a processing operation of the mobile device 4000.

A memory system or a storage device in accordance with the embodiments of the inventive concept may be mounted using various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

According to an embodiment of the inventive concept, a clock gating circuit that operates at high speed may be provided by controlling charge-discharge nodes through a control unit and reducing a delay path between a clock enable signal and an output clock signal.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. The inventive concept is defined by the following claims, with equivalents of the claims to be included therein.

What is claimed is:

1. A clock gating circuit comprising:
a first precharge unit configured to charge a first node based on a clock signal;
a second precharge unit configured to charge a second node based on the clock signal;
a first discharge unit configured to discharge the first node based on the clock signal;
a second discharge unit configured to discharge the second node based on the clock signal;
a first cross-coupled maintain unit configured to maintain the first node at a charge state according to a voltage level of the second node;
a second cross-coupled maintain unit configured to maintain the second node at the charge state according to a voltage level of the first node; and
a control unit configured to control the first and second discharge units to discharge the first node or the second node based on a clock enable signal,
wherein the control unit is configured to control the second discharge unit so that an output clock signal having a waveform corresponding to the clock signal is output at the second node during a specific time according to the clock enable signal.

2. The clock gating circuit of claim 1, wherein in a case that the clock signal is a first level, the first and second precharge units are configured to charge the first and second nodes to a second level.

3. The clock gating circuit of claim 2, wherein in a case that the clock signal is the second level and the clock enable signal is the first level, the first discharge unit is configured to discharge the first node to the first level.

4. The clock gating circuit of claim 2, wherein in a case that the clock signal is the second level and the clock enable signal is the second level, the second discharge unit is configured to discharge the second node to the first level.

5. The clock gating circuit of claim 2, wherein in a case that the second node is discharged to the first level, the first cross-coupled maintain unit is configured to maintain the first node at the second level.

6. The clock gating circuit of claim 2, wherein in a case that the first node is discharged to the first level, the second cross-coupled maintain unit is configured to maintain the second node at the second level.

7. The clock gating circuit of claim 2, wherein the control unit is configured to generate a control signal for controlling the first and second discharge units through a logic operation of voltage levels of the first and second nodes and the clock enable signal.

8. The clock gating circuit of claim 2, wherein the first level is a low level and the second level is a high level.

9. The clock gating circuit of claim 1, further comprising an inverting unit configured to invert the output clock signal, wherein the control unit is configured to perform an OR operation on the clock enable signal and an output signal of the inverting unit, and an AND operation on a voltage level of the first node and a result value of the OR operation, to generate a control signal for controlling the first and second discharge units.

10. A clock gating circuit comprising:
a first transistor having a first end connected to a power supply node and a second end connected to a first node, the first transistor configured to be turned on according to a clock signal to charge the first node;
a second transistor having a first end connected to the power supply node and a second end connected to a second node at which an output clock signal is provided, the second transistor configured to be turned on according to the clock signal to charge the second node;
a third transistor having a first end connected to the power supply node and a second end connected to the first node, the third transistor configured to be turned on according to a voltage level of the second node to charge the first node;

a fourth transistor having a first end connected to the power supply node and a second end connected to the second node, the fourth transistor configured to be turned on according to a voltage level of the first node to charge the second node;

a fifth transistor configured to be turned on according to the clock signal;

a sixth transistor having a first end connected to a first end of the fifth transistor, is the sixth transistor configured to be turned on according to a voltage level of a third node to discharge the first node;

a seventh transistor having a first end connected to the second node and a second end connected to the third node, the seventh transistor configured to be turned on according to the clock signal to discharge the second node based on a voltage level of the third node; and a control unit configured to control the voltage level of the third node based on a clock enable signal so that the first node or the second node is discharged, wherein in a case that the fifth and sixth transistors are turned on, a second end of the fifth transistor and a second end of the sixth transistor are connected to the first node to discharge the first node.

11. The clock gating circuit of claim 10, wherein in the case that a clock signal is a first level, the first and second transistors are turned on.

12. The clock gating circuit of claim 11, wherein in a case that a level of the clock signal and the voltage level of the third node are a second level different from the first level, the fifth and sixth transistors are turned on.

13. The clock gating circuit of claim 12, wherein in the case that a clock signal is the second level, the seventh transistor is turned on.

14. The clock gating circuit of claim 12, wherein in a case that a voltage level of the second node is the first level, the third transistor is turned on and thereby the first node is maintained at the second level, and wherein in a case that a voltage level of the first node is the first level, the fourth transistor is turned on and thereby the second node is maintained at the second level.

15. The clock gating circuit of claim 10, wherein the control unit comprises:

a first control transistor having a first end connected to the power supply node and a second end connected to the third node, and having a gate at which a voltage level of the first node is applied;

a second control transistor having a first end connected to the third node, and having a gate at which the clock enable signal is applied;

a third control transistor having a first end connected to the power supply node and a second end connected to a second end of the second control transistor, and having a gate at which an inverted voltage level of the second node is applied;

a fourth control transistor having a first end connected to a ground node, and having a gate at which the voltage level of the first node is applied;

a fifth control transistor having a first end connected to the third node and a second end connected to a second end of the fourth control transistor, and having a gate at which the clock enable signal is applied; and a sixth control transistor having a first end connected to the third node and a second end connected to the second end of the fourth control transistor, and having a gate at which the inverted voltage level of the second node is applied.

16. A clock gating circuit comprising:

a first precharge unit configured to charge a first node based on a clock signal;

a second precharge unit configured to charge a second node based on the clock signal;

a first discharge unit configured to discharge the first node based on the clock signal;

a second discharge unit configured to discharge the second node based on the clock signal;

a first cross-coupled maintain unit configured to maintain the first node at a charge state according to a voltage level of the second node;

a second cross-coupled maintain unit configured to maintain the second node at the charge state according to a voltage level of the first node; and a control unit configured to control the first and second discharge units to discharge the first node or the second node responsive to a clock enable signal, the voltage level of the first node, and an inverted voltage level of the second node wherein in a case that the clock signal is a first level, the first and second precharge units are configured to charge the first and second nodes to a second level.

17. The clock gating circuit of claim 16, wherein in a case that the second node is discharged to the first level, the first cross-coupled maintain unit is configured to maintain the first node at the second level, and wherein in a case that the first node is discharged to the first level, the second cross-coupled maintain unit is configured to maintain the second node at the second level.

18. The clock gating circuit of claim 16, wherein the first level is a low level and the second level is a high level.

19. The clock gating circuit of claim 16, wherein the control unit is configured to control the second discharge unit so that an output clock signal having a waveform corresponding to the clock signal is output at the second node during a specific time according to the clock enable signal.

* * * * *